(12) United States Patent
Mitsuyoshi

(10) Patent No.: US 8,757,180 B2
(45) Date of Patent: Jun. 24, 2014

(54) SUBSTRATE PROCESSING APPARATUS

(75) Inventor: Ichiro Mitsuyoshi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1299 days.

(21) Appl. No.: 12/029,735

(22) Filed: Feb. 12, 2008

(65) Prior Publication Data

US 2008/0199283 A1    Aug. 21, 2008

(30) Foreign Application Priority Data

Feb. 15, 2007  (JP) ................................ 2007-034205

(51) Int. Cl.
*H01L 21/67* (2006.01)
*H01L 21/673* (2006.01)
*H01L 21/677* (2006.01)

(52) U.S. Cl.
USPC ........... 134/151; 134/149; 134/157; 134/153; 134/158; 414/222.01; 414/222.07; 414/222.08; 414/223.02; 414/223.01

(58) Field of Classification Search
USPC ............. 414/222.01, 222.07, 222.08, 223.02, 414/223.01; 134/157, 149, 151, 153, 158
See application file for complete search history.

(56) References Cited

U.S. PATENT DOCUMENTS

| | | | |
|---|---|---|---|
| 5,989,346 A * | 11/1999 | Hiroki ............................ | 118/719 |
| 6,377,329 B1 * | 4/2002 | Takekuma ....................... | 355/27 |
| 6,893,171 B2 | 5/2005 | Fukutomi et al. | |
| 7,878,213 B2 * | 2/2011 | Mitsuyoshi .................... | 134/133 |
| 2002/0157692 A1 * | 10/2002 | Ishihara et al. ................ | 134/134 |
| 2003/0029479 A1 * | 2/2003 | Asano ............................. | 134/18 |
| 2004/0055707 A1 | 3/2004 | Sato et al. | |
| 2005/0236268 A1 | 10/2005 | Mishima et al. | |
| 2006/0016462 A1 | 1/2006 | Asano | |
| 2006/0045722 A1 * | 3/2006 | Hashimoto .................... | 414/754 |
| 2007/0186850 A1 | 8/2007 | Matsuoka et al. | |

FOREIGN PATENT DOCUMENTS

| | | |
|---|---|---|
| CN | 1712333 | 12/2005 |
| JP | 10-064860 | 3/1998 |
| JP | 2000-58622 | 2/2000 |
| JP | 2002-324828 | 11/2002 |
| JP | 2003-59885 | 2/2003 |
| JP | 2004-146708 | 5/2004 |
| JP | 2004-327674 | 11/2004 |
| JP | 2005-203635 | 7/2005 |
| JP | 2005-307274 | 11/2005 |
| JP | 2006-12880 | 1/2006 |
| JP | 2006-216886 | 8/2006 |

* cited by examiner

*Primary Examiner* — Michael Kornakov
*Assistant Examiner* — Katelyn Whatley
(74) *Attorney, Agent, or Firm* — Ostrolenk Faber LLP

(57) ABSTRACT

In a processing block, a plurality of back surface cleaning units and a main robot are provided. The main robot is provided between the back surface cleaning units provided on one side of the processing block and the back surface cleaning units provided on the other side of the processing block. A reversing unit used to reverse a substrate and a substrate platform used to transfer and receive substrates between an indexer robot and the main robot are provided adjacent to each other in the vertical direction between the indexer robot and the processing block. The main robot transports substrates among the plurality of back surface cleaning units, the substrate platform, and the reversing unit.

12 Claims, 15 Drawing Sheets

SUBSTRATE PROCESSING APPARATUS

CROSS REFERENCE TO RELATED APPLICATIONS

This application is related to Ser. No. 12/029,608 of Ichiro Mitsuyoshi et al. titled SUBSTRATE PROCESSING APPARATUS filed Feb. 12, 2008.

BACKGROUND OF THE INVENTION

1. Field of the Invention

The present invention relates to a substrate processing apparatus that processes substrates.

2. Description of the Background Art

Substrate processing apparatuses have been used to carry out various kinds of processing to substrates such as semiconductor wafers and glass substrates for a photomask, a liquid crystal display, and an optical disk.

For example, JP 2004-146708 A discloses a substrate processing apparatus that includes a reversing unit that reverses the top surface and the back surface of a substrate. In the disclosed substrate processing apparatus, a center robot (transport unit) that transports a substrate is arranged substantially in the center of the rectangular processing section.

In the processing section, a plurality of (four, for example) back surface cleaning units that carry out cleaning processing to the back surfaces of substrates are provided to surround the center robot. Furthermore, the reversing unit is arranged in a position accessible by the center robot in the processing section.

On one end side of the processing section, an indexer section including a plurality of storing containers that store substrates is provided. The indexer section is provided with a substrate transport robot that takes out a substrate prior to processing from a storing container or stores a substrate after processing in a storing container.

In this configuration, the substrate transport robot takes out a substrate prior to processing from any of the storing containers and delivers the substrate to the center robot and receives a substrate after processing from the center robot to store the substrate to any of the storing containers.

Upon receiving a substrate prior to processing from the substrate transport robot, the center robot delivers the received substrate to the reversing unit. The reversing unit reverses the substrate received from the center robot so that the top surface of the substrate is directed downward. The center robot then receives the substrate reversed by the reversing unit and carries the substrate into any one of the back surface cleaning units.

Subsequently, when the processing in the above-described back surface cleaning unit ends, the center robot takes out the substrate from the back surface cleaning unit and delivers the substrate again to the reversing unit. The reversing unit reverses the substrate so that the top surface of the substrate processed in the back surface cleaning unit is directed upward.

The center robot receives the substrate reversed by the reversing unit and delivers it to the substrate transport robot. The substrate transport robot stores the processed substrate received from the center robot in a storing container.

In this way, a substrate prior to processing stored in a storing container is reversed by the reversing unit to be subjected to processing (to the back surface of the substrate) in the back surface cleaning unit, then again reversed by the reversing unit, and stored in a storing container as a processed substrate.

In the above-described substrate processing apparatus, during the transport of the substrate among the transport robot, the back surface cleaning unit, and the reversing unit, the center robot holding the substrate rotates around the vertical axis.

Therefore, the time for transporting a substrate depends on the rotating angle of the center robot. More specifically, during the transport of a substrate among the transport robot, the back surface cleaning unit, and the reversing unit, as the rotating angle of the center robot increases, the time for transporting the substrate is prolonged.

Here, in the above-described substrate processing apparatus, the reversing unit is provided at the other end side of the processing section. That is to say, the center robot is positioned between the substrate transport robot of the indexer section and the reversing unit.

In this way, the center robot has to rotate during the transport of a substrate between the indexer section and the reversing unit by 180 degrees each before and after the processing. Further, in order to deliver a substrate prior to processing reversed by the reversing unit to a back surface cleaning unit, the center robot also has to rotate a prescribed angle more from the direction directed to the reversing unit. Therefore, throughput improvement in the substrate processing is limited.

SUMMARY OF THE INVENTION

It is an object of the invention to provide a substrate processing apparatus that allows the throughput in substrate processing to be sufficiently improved.

(1) According to one aspect of the invention, a substrate processing apparatus processes a substrate having a main surface and a back surface includes a processing region in which a substrate is processed, an carrying in and out region through which a substrate is carried into or carried out from the processing region, and an interface region through which a substrate is transferred between the processing region and the carrying in and out region, the processing region includes a processing section that processes a substrate, and a first transport device that rotates around a substantially vertical axis and transports a substrate between the interface region and the processing section, the interface region includes a substrate platform on which a substrate is placed, and a reversing device that is provided above or below the substrate platform in a stacked manner and reverses one surface and the other surface of a substrate from each other, and the interface region, the processing section and the first transport device being arranged so that the rotation angle of the first transport device during the transport of a substrate between the interface region and the processing section is approximately 90 degrees.

In the substrate processing apparatus, a substrate is carried into the first transport device in the processing region from the carrying in and out region through the interface region and is transported to the processing section from the interface region by the first transport device. Then, the substrate is processed by the processing section. The substrate processed by the processing section is carried out from the processing section by the first transport device to the carrying in and out region through the interface region.

Here, in the interface region, a substrate is placed on the substrate platform when the substrate is carried in/out. When the substrate is carried in/out, one surface and the other surfaces of the substrate are reversed by the reversing device. In this way, the other surface of the substrate carried into the processing region as its one surface directed upward may be processed by the processing section or the substrate processed as its one surface directed upward may be carried out to the carrying in and out region as its other surface directed upward.

Here, the first transport device rotates about 90 degrees around the vertical axis when a substrate is transported between the interface region and the processing section. In this way, as compared to the case in which the carrying in and out region and the processing section are placed opposite to each other with the first transport device therebetween, the distance for the first transport device to transport a substrate is shortened, so that the time required for transporting the substrate is reduced. Consequently, the throughput in the substrate processing is sufficiently improved.

(2) The first transport device may have a first supporter supporting a substrate and capable of advancing/withdrawing in a substantially horizontal direction, and the first supporter may advance/withdraw in a first advancing/withdrawing direction parallel to the direction of a first axis with respect to the substrate platform during transfer or receipt of a substrate to or from the substrate platform and in a second advancing/withdrawing direction parallel to the direction of a second axis that is substantially perpendicular to the first axial direction during carrying in/out of a substrate to the processing section.

In this case, the first transport device supports the substrate placed on the substrate platform by advancing/withdrawing the first supporter with respect to the substrate platform in the first advancing/withdrawing direction parallel to the first axial direction.

The first transport device rotates about 90 degrees around the vertical axis. In this way, the first transport device can easily transport an unprocessed substrate supported by the first supporter to the processing section by advancing/withdrawing the first supporter in the second advancing/withdrawing direction parallel to the second axial direction substantially perpendicular to the first axial direction.

Furthermore, the first transport device supports a substrate processed by the processing section by the first supporter by advancing/withdrawing the first supporter with respect to the processing section in the second advancing/withdrawing direction. The first transport device then rotates about 90 degrees around the vertical axis. In this way, the first transport device can easily transport a processed substrate supported by the first supporter to the interface region by advancing/withdrawing the first supporter in the first advancing/withdrawing direction.

(3) The processing section may include a first processing section aligned on one side of the first transport device in the direction parallel to the second axial direction, and a second processing section aligned on the other side of the first transport device in the direction parallel to the second axial direction.

In this case, the first transport device can rotate about 90 degrees around the vertical axis, so that a substrate can easily be transported for a short period between the interface region and the first processing section.

The first transport device can rotate about 90 degrees in the opposite direction around the vertical axis, so that a substrate can easily be transported for a short period between the interface region and the second processing section.

The first transport device can rotate about 180 degrees around the vertical axis, so that a substrate can easily be transported for a short period between the first processing section and the second processing section.

Consequently, the throughput in the substrate processing in the first or second processing section is sufficiently improved.

(4) At least one of the first and second processing sections may include a back surface cleaning processing section that cleans the back surface of a substrate.

In this way, the back surface of the substrate can be cleaned by the back surface cleaning unit provided in at least one of the first and second processing sections. Therefore, the cleanliness of the substrate can sufficiently be improved.

(5) Each of the first and second processing sections may include the back surface cleaning processing section. In this way, the back surface of the substrate can be cleaned by the back surface cleaning unit provided in any one of the first and second processing sections. Therefore, the back surface of a substrate can efficiently be cleaned by the first or second processing section.

(6) The back surface cleaning processing section in the first processing section may include a plurality of back surface cleaning units arranged in a plurality of stages and the back surface cleaning processing section in the second processing section may include a plurality of back surface cleaning units arranged in a plurality of stages.

In this way, the back surface of a substrate can be cleaned by the plurality of back surface cleaning units provided at any one of the first and second processing sections. Therefore, the back surfaces of substrates can efficiently be cleaned by the first and second processing sections. Consequently, the throughput in the substrate processing in the first or second processing section is sufficiently improved.

(7) The first processing section may include the back surface cleaning processing section and the second processing section may include a top surface cleaning processing section that cleans the top surface of a substrate.

In this way, the back surface of a substrate can be cleaned by the back surface cleaning section provided at the first processing section. The top surface of a substrate can be cleaned by the top surface cleaning section provided at the second processing section.

Therefore, a substrate cleaned at one of the first and second processing sections can be reversed by the reversing device and carried into the other processing section, so that the top and back surfaces of the substrate can easily be cleaned. Consequently, the cleanliness of the substrate can sufficiently be improved.

(8) The back surface cleaning processing section in the first processing section may include a plurality of back surface cleaning units arranged in a plurality of stages, and the top surface cleaning processing section in the second processing section may include a plurality of top surface cleaning units arranged in a plurality of stages.

In this way, the back surface of a substrate can be cleaned by the plurality of back surface cleaning units provided at the first processing section. Therefore, the back surface of the substrate can be cleaned sufficiently and efficiently by the plurality of back surface cleaning units.

The top surface of a substrate can be cleaned by the plurality of top surface cleaning units provided at the second processing section. In this way, the top surface of the substrate can be cleaned sufficiently and efficiently by the plurality of top surface cleaning units. Consequently, the throughput in the substrate processing is improved.

(9) The carrying in and out region may include a container platform on which a storing container for storing a substrate is provided, and a second transport device that rotates around a substantially vertical axis and transports a substrate between the storing container provided on the container platform and the interface region, and the second transport device may have a second supporter supporting a substrate and capable of advancing/withdrawing substantially horizontally and may be provided movably parallel to the second axial direction.

In this way, the second transport device supports an unprocessed substrate stored in the storing container by the second supporter by advancing/withdrawing the second supporter with respect to the storing container placed on the container platform.

The second transport device moves parallel to the second axial direction and rotates around a substantially vertical axis. The second transport device can easily transfer an unprocessed substrate supported by the second supporter to the interface region by advancing/withdrawing the second supporter.

Furthermore, the second transport device supports a processed substrate by the second supporter by advancing/withdrawing the second supporter with respect to the interface region. The second transport device rotates around a substantially vertical axis and moves parallel to the second axial direction. The second transport device can easily store the processed substrate supported by the second supporter in the storing container on the container platform by advancing/withdrawing the second supporter.

(10) The reversing device may be arranged in a stacked manner immediately above or below the substrate platform, and the first transport device may be moved up and down to transport a substrate between the reversing device and the substrate platform.

In this way, the reversing device is arranged in a layered manner immediately above or below the substrate platform, so that the distance between the reversing device and substrate platform is reduced. Therefore, the distance for the first transport device to transport between the reversing device and substrate platform is reduced, which reduces the transporting time. Consequently, the throughput in the substrate processing is sufficiently improved.

(11) The reversing device may include a first holding mechanism that holds the substrate in a state vertical to a third axis, a second holding mechanism that holds the substrate in the state vertical to the third axis, a supporting member that supports the first and second holding mechanisms so that the first and second holding mechanisms overlap with each other in a direction of the third axis, and a rotating device that integrally rotates the supporting member together with the first and second holding mechanisms around a fourth axis that is substantially vertical to the third axis.

In this case, the substrate is held by at least one of the first and second holding mechanisms in the state vertical to the third axis. In the state, the first and second holding mechanisms are integrally rotated around the fourth axis that is substantially vertical to the third axis by the rotating device. Thus, the substrate held by the first holding mechanism or the second holding mechanism is reversed.

Here, when each of the above-mentioned first transport devices has two transport holders and carries the substrate into and out of the reversing device by using the two transport holders, the two transport holders are arranged to overlap with each other in a direction parallel to the third axis, so that the two substrates can be simultaneously carried into the first and second holding mechanisms by the two transport holders while the two substrates can be simultaneously carried out of the first and second holding mechanisms by the two transport holders. Accordingly, the plurality of substrates can be efficiently reversed while the substrates can be quickly carried into and out of the reversing device.

(12) The first and second holding mechanisms may include a common reverse holding member having one surface and the other surface that are vertical to the third axis, the first holding mechanism may include a plurality of third supporters that are provided on the one surface of the common reverse holding member and support a periphery of the substrate, a first reverse holding member provided so as to face the one surface of the common reverse holding member, a plurality of fourth supporters that are provided on a surface, which faces the common reverse holding member, of the first reverse holding member and support the periphery of the substrate and a first driving mechanism that moves at least one of the first reverse holding member and the common reverse holding member so that the first reverse holding member and the common reverse holding member are selectively shifted between a state where the first reverse holding member and the common reverse holding member are spaced apart from each other in the direction of the third axis and a state where the first reverse holding member and the common reverse holding member are close to each other, and the second holding mechanism may include a plurality of fifth supporters that are provided on the other surface of the common reverse holding member and support the periphery of the substrate, a second reverse holding member provided so as to face the other surface of the common reverse holding member, a plurality of sixth supporters that are provided on a surface, which faces the common reverse holding member, of the second reverse holding member and support the periphery of the substrate and a second driving mechanism that moves at least one of the second reverse holding member and the common reverse holding member so that the second reverse holding member and the common reverse holding member are selectively shifted between a state where the second reverse holding member and the common reverse holding member are spaced apart from each other in the direction of the third axis and a state where the second reverse holding member and the common reverse holding member are close to each other.

In this case, the substrate is inserted into a space between the plurality of third supporters provided on the one surface of the common reverse holding member and the plurality of fourth supporters provided on the surface, which faces the common reverse holding member, of the first reverse holding member in the state where the first reverse holding member and the common reverse holding member are spaced apart from each other. In the state, at least one of the first reverse holding member and the common reverse holding member is moved by the first driving mechanism so that the first reverse holding member and the common reverse holding member are close to each other. Thus, the periphery of the substrate is held by the plurality of third supporters and the plurality of fourth supporters.

In this state, the first reverse holding member, the second reverse holding member and the common reverse holding member are integrally rotated around the fourth axis by the rotating device. Accordingly, the substrate held by the first reverse holding member and the common reverse holding member is reversed.

Moreover, the substrate is inserted into a space between the plurality of fifth supporters provided on the other surface of the common reverse holding member and the plurality of sixth supporters provided on the surface, which faces the common reverse holding member, of the second reverse holding member in the state where the second reverse holding member and the common reverse holding member are spaced apart from each other. In the state, at least one of the second reverse holding member and the common reverse holding member is moved by the second driving mechanism so that the second reverse holding member and the common reverse holding member come close to each other. Thus, the periphery of the substrate is held by the plurality of fifth supporters and the plurality of sixth supporters.

In this state, the first reverse holding member, the second reverse holding member and the common reverse holding member are integrally rotated around the fourth axis by the rotating device. Accordingly, the substrate held by the second reverse holding member and the common reverse holding member is reversed.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
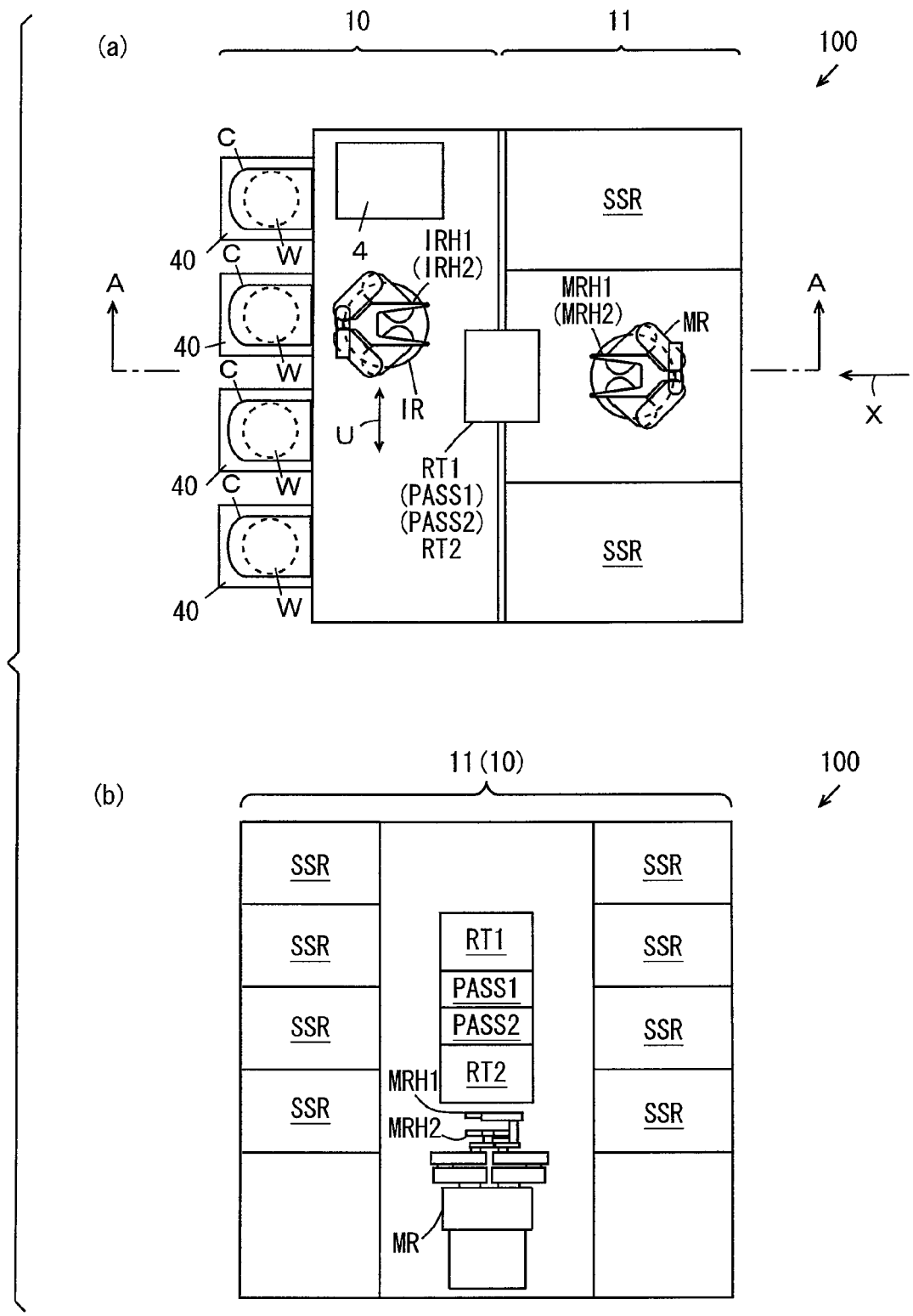
FIG. 1(a) is a plan view of a substrate processing apparatus according to a first embodiment of the invention.
FIG. 1(b) is a schematic side view of the substrate processing apparatus in FIG. 1(a) viewed in the direction of arrow X.

Now, a reversing device according to an embodiment of the invention and a substrate processing apparatus including the device will be described in conjunction with the accompanying drawings.

In the following description, the term "substrate" refers to a semiconductor wafer, a glass substrate for a liquid crystal display, a glass substrate for a PDP (plasma display panel), a glass substrate for a photomask, a substrate for an optical disk or the like.

In addition, in the following description, a surface of the substrate on which various patterns such as a circuit pattern or the like are to be formed will be referred to as "top surface" and the opposite surface thereof will be referred to as "back surface." The surface of the substrate directed downward will be referred to as "lower surface" and the surface of the substrate directed upward will be referred to as "upper surface."

(1) First Embodiment

Now, a substrate processing apparatus according to a first embodiment of the invention will be described with reference to the drawings.

(1-1) Configuration of Substrate Processing Apparatus

FIG. 1(a) is a plan view of a substrate processing apparatus according to the first embodiment of the invention, and FIG. 1(b) is a schematic side view of the substrate processing apparatus in FIG. 1(a) viewed in the direction of arrow X. FIG. 2 is a schematic sectional view taken along line A-A in FIG. 1(a).

As shown in FIG. 1(a), the substrate processing apparatus 100 has an indexer block 10 and a processing block 11. The indexer block 10 and the processing block 11 are provided parallel to each other.

The indexer block 10 is provided with a plurality of carrier platforms 40, an indexer robot IR and a controller 4. A carrier C that stores a plurality of W in a plurality of stages is placed on each carrier platform 40. The indexer robot IR is provided so that it can be moved in the direction of arrow U (FIG. 1(a)), rotated around the vertical axis and moved up and down in the vertical direction. The indexer robot IR is provided with hands IRH1 and IRH2 one above the other used to transfer and receive a substrate W. The hands IRH1 and IRH2 hold the peripheral portion of the lower surface and the outer edge of a substrate W. The controller 4 includes a computer or the like including a CPU (central processing unit) and controls various parts in the substrate processing apparatus 100.

As shown in FIG. 1(b), the processing block 11 is provided with a plurality of (eight in this example) back surface cleaning units SSR and a main robot MR. On one side of the processing block 11, a plurality of (four in this example) back surface cleaning units SSR are stacked in the vertical direction. Similarly, a plurality of (four in this example) back surface cleaning units SSR are stacked in the vertical direction on the other side of the processing block 11. The main robot MR is provided between the back surface cleaning units SSR provided on one side of the processing block 11 and the back surface cleaning units SSR provided on the other side of the processing block 11. The main robot MR is provided so that it can be rotated around the vertical axis and moved up and down in the vertical direction. The main robot MR is provided with hands MRH1 and MRH2 one above the other that is used to transfer and receive a substrate W. The hands MRH1 and MRH2 hold the peripheral portion and the outer edge of the lower surface of a substrate W. The main robot MR will be described in detail in the following paragraphs.

As shown in FIG. 2, reversing units RT1 and RT2 used to reverse substrates W and substrate platforms PASS1 and PASS2 used to transfer and receive substrates between the indexer robot IR and the main robot MR are provided in the vertical direction between the indexer block 10 and the processing block 11. The reversing unit RT1 is provided above the substrate platforms PASS1 and PASS2, and the reversing unit RT2 is provided under the substrate platforms PASS1 and PASS2. In this way, the reversing unit RT1 and the substrate platform PASS1 are adjacent to each other in the vertical direction, and the reversing unit RT2 and the substrate platform PASS2 are adjacent to each other in the vertical direction. The reversing units RT1 and RT2 will be described in detail in the following paragraphs.

The upper substrate platform PASS1 is used to transport a substrate W from the processing block 11 to the indexer block 10, and the lower substrate platform PASS2 is used to transport a substrate W from the indexer block 10 to the processing block 11.

The substrate platforms PASS1 and PASS2 are each provided with an optical sensor (not shown) that detects the presence/absence of a substrate W. In this way, it can be determined whether or not a substrate W is placed on the substrate platforms PASS1 and PASS2. The substrate platforms PASS1 and PASS2 are also provided with a plurality of support pins 51 that support the lower surface of substrates W. When a substrate W is transferred and received between the indexer robot IR and the main robot MR, the substrate W is temporarily placed on the support pins 51 of the substrate platform PASS1 and PASS2.

(1-2) Summary of Operation of Substrate Processing Apparatus

Now, with reference to FIGS. 1 and 2, general operation of the substrate processing apparatus 100 will be described. Note that the operation of elements of the substrate processing apparatus 100 in the following paragraphs is controlled by the controller 4 shown in FIG. 1.

The indexer robot IR takes an unprocessed substrate W using the lower hand IRH2 from one of the carriers C placed on the carrier platforms 40. At the point, the substrate W has its top surface directed upward. The hand IRH2 of the indexer robot IR holds the peripheral portion and the outer edge of the back surface of the substrate W. The indexer robot IR moves in the direction of arrow U while it rotates around the vertical axis and places the unprocessed substrate W on the substrate platform PASS2.

The substrate W placed on the substrate platform PASS2 is received by the main robot MR and carried into the reversing unit RT2. In the reversing unit RT2, the substrate W having its top surface directed upward is reversed so that its back surface is directed upward. The operation of the reversing units RT1 and RT2 will be described in detail in the following paragraphs. The reversed substrate W is carried out from the reversing unit RT2 by the main robot MR and then carried into a back surface cleaning unit SSR. In the back surface cleaning unit SSR, the back surface of the substrate W is subjected to cleaning processing. Hereinafter, the cleaning processing to the back surface of the substrate W will be referred to as "back surface cleaning processing." Note that the back surface cleaning processing by the back surface cleaning unit SSR will be described in detail in the following paragraphs.

The substrate W after the back surface cleaning processing is carried out from the back surface cleaning unit SSR by the main robot MR, and then carried into the reversing unit RT1. In the reversing unit RT1, the substrate W having its back surface directed upward is reversed so that its top surface is directed upward. The reversed substrate W is carried out from the reversing unit RT1 by the main robot MR and placed on the substrate platform PASS1. The substrate W placed on the substrate platform PASS1 is received by the indexer robot IR and stored in a carrier C.

(1-3) Details of Main Robot

Now, the configuration of the main robot MR will be described in detail. FIG. 3(a) is a side view of the main robot MR, and FIG. 3(b) is a plan view of the main robot MR.

As shown in FIGS. 3(a) and 3(b), the main robot MR includes a base 21 and a moving portion 22 capable of being moved up and down and rotatable with respect to the base 21. The moving portion 22 is connected to the hand MRH1 through a multi-joint type arm AM1 and to the hand MRH2 through a multi-joint type arm AM2.

The moving portion 22 is moved in the vertical direction by a lifting mechanism 25 provided in the base 21 and rotated around the vertical axis by a turning driving mechanism 26 provided in the base 21. The multi-joint type arms AM1 and AM2 are each independently driven by a driving mechanism that is not shown and move the hands MRH1 and MRH2 in the horizontal direction while keeping these hands in a fixed posture. The hands MRH1 and MRH2 are provided at a fixed height with respect to the moving portion 22, and the hand MRH1 is above the MRH2. The difference M1 in height between the hand MRH1 and hand MRH2 (FIG. 3(a)) is kept constant.

The hands MRH1 and MRH2 have the same approximate U-shape. The hand MRH1 has two claws H11 extending in its advancing/withdrawing direction, and the hand MRH2 has two claws H12 extending in its advancing/withdrawing direction. A plurality of support pins 23 are attached on each of the hands MRH1 and MRH2. According to the embodiment, four support pins 23 are provided substantially evenly along the outer circumference of a substrate W placed on each of the MRH1 and MRH2. The substrate W has its peripheral portion and the outer edge of the lower surface held by the four support pins 23.

Now, with reference to FIGS. 1 and 2, the order of operation by the main robot MR according to the embodiment will be described.

The main robot MR receives an unprocessed substrate W from the substrate platform PASS2 by the hand MRH1. At the time, the substrate W received by the hand MRH1 has its top surface directed upward. The main robot MR is then moved up and down by the lifting mechanism 25. The main robot MR receives a substrate W having its back surface directed upward from the reversing unit RT2 by the hand MRH2. The main robot MR then carries the substrate W held by the hand MRH1 into the reversing unit RT2.

The main robot MR then rotates 90 degrees around the vertical axis by the turning driving mechanism 26 and is moved up and down by the lifting mechanism 25. The main robot MR carries a substrate W after back surface cleaning processing from one of the back surface cleaning units SSR by the hand MRH1 and carries the substrate W held by the hand MRH2 into the back surface cleaning unit SSR.

The main robot MR then rotates 90 degrees in the direction opposite to the immediately previous rotation direction and is moved up and down. The main robot MR then receives a substrate W having its top surface directed upward from the reversing unit RT1 by the hand MRH2. The main robot MR then carries the substrate W held by the hand MRH1 into the reversing unit RT1.

The main robot MR is then moved up and down by the lifting mechanism 25. The main robot MR places the substrate W held by the hand MRH2 on the substrate platform PASS1 and again receives an unprocessed substrate W from the substrate platform PASS2 by the hand MRH1. The main robot MR continuously carries out the series of operation.

(1-4) Details of Reversing Unit

Figure 4:
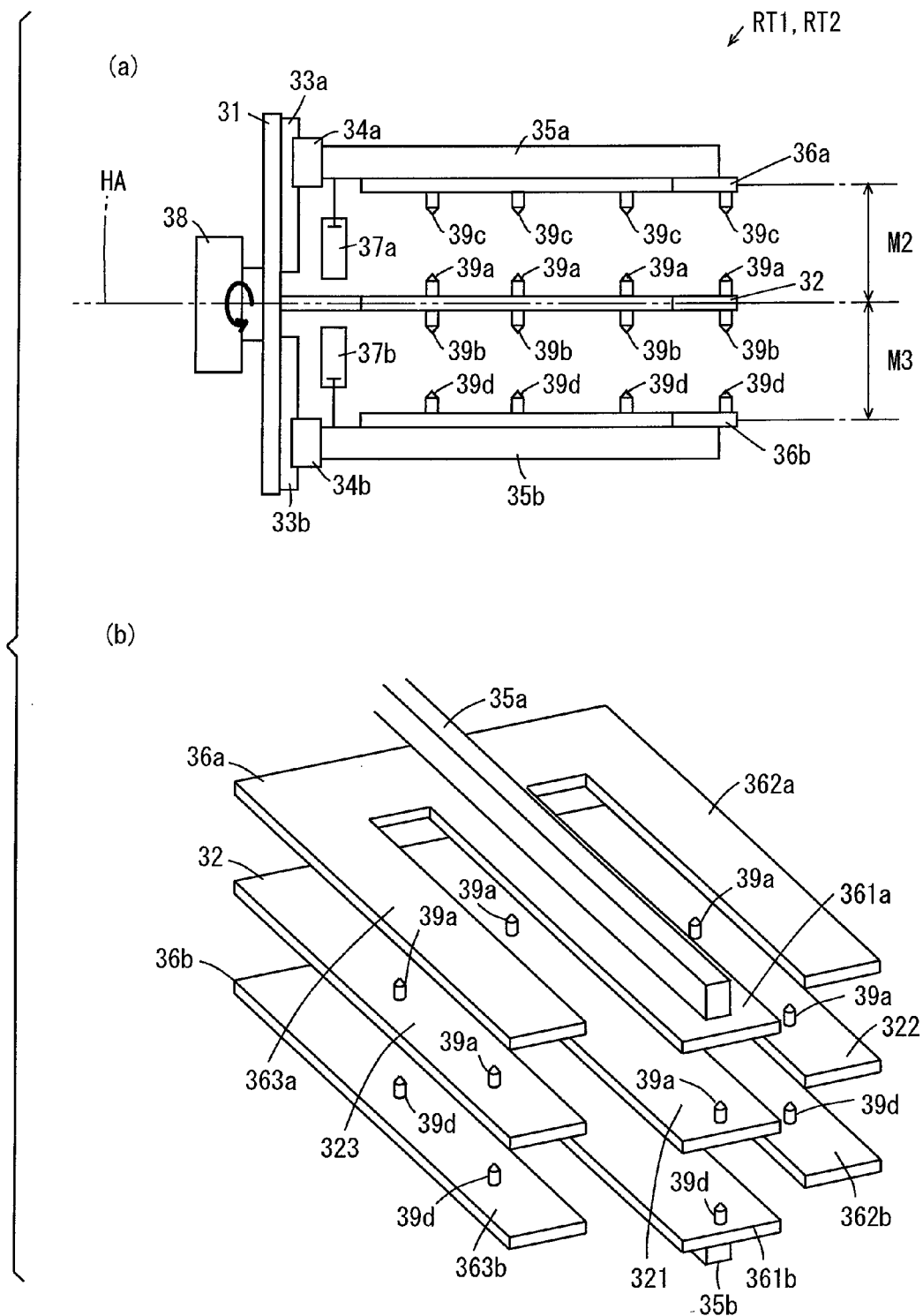
FIG. 4(a) is a side view of reversing units and FIG. 4(b) is a perspective view of the reversing units.

Now, the reversing units RT1 and RT2 will be described in detail. The reversing units RT1 and RT2 have the same configuration. FIG. 4(a) is a side view of the reversing unit RT1 or RT2, and FIG. 4(b) is a perspective view of the reversing unit RT1 or RT2.

As shown in FIG. 4(a), the reversing unit RT1 or RT2 includes a supporting plate 31, a fixed plate 32, a pair of linear guides 33a and 33b, a pair of supporting members 35a and 35b, a pair of cylinders 37a and 37b, a first movable plate 36a, a second movable plate 36b, and a rotary actuator 38.

The supporting plate 31 is provided to extend in the vertical direction, and the fixed plate 32 is provided to extend horizontally from the central part of one surface of the supporting plate 31. In a region of the supporting plate 31 on one surface side of the fixed plate 32, the linear guide 33a is provided to extend perpendicularly to the fixed plate 32. In a region of the supporting plate 31 on the other surface side of the fixed plate 32, the linear guide 33b is provided to extend perpendicularly to the fixed plate 32. The linear guides 33a and 33b are provided symmetrically with each other with respect to the fixed plate 32.

On one surface side of the fixed plate 32, the supporting member 35a is provided to extend parallel to the fixed plate 32. The supporting member 35a is slidably attached to the linear guide 33a with a coupling member 34a. The supporting member 35a is connected with the cylinder 37a that allows the supporting member 35a to be lifted and lowered along the linear guide 33a. In this case, the supporting member 35a moves perpendicularly to the fixed plate 32 in a fixed posture. The supporting member 35a is provided with the first movable plate 36a facing one surface of the fixed plate 32.

On the other surface side of the fixed plate 32, the supporting member 35b is provided to extend parallel to the fixed plate 32. The supporting member 35b is slidably attached to the linear guide 33b with a coupling member 34b. The supporting member 35b is connected with the cylinder 37b that allows the supporting member 35b to be lifted and lowered along the linear guide 33b. In this case, the supporting member 35b moves perpendicularly to the fixed plate 32 in a fixed posture. The supporting member 35b is provided with the second movable plate 36b facing the other surface of the fixed plate 32.

Figure 3:
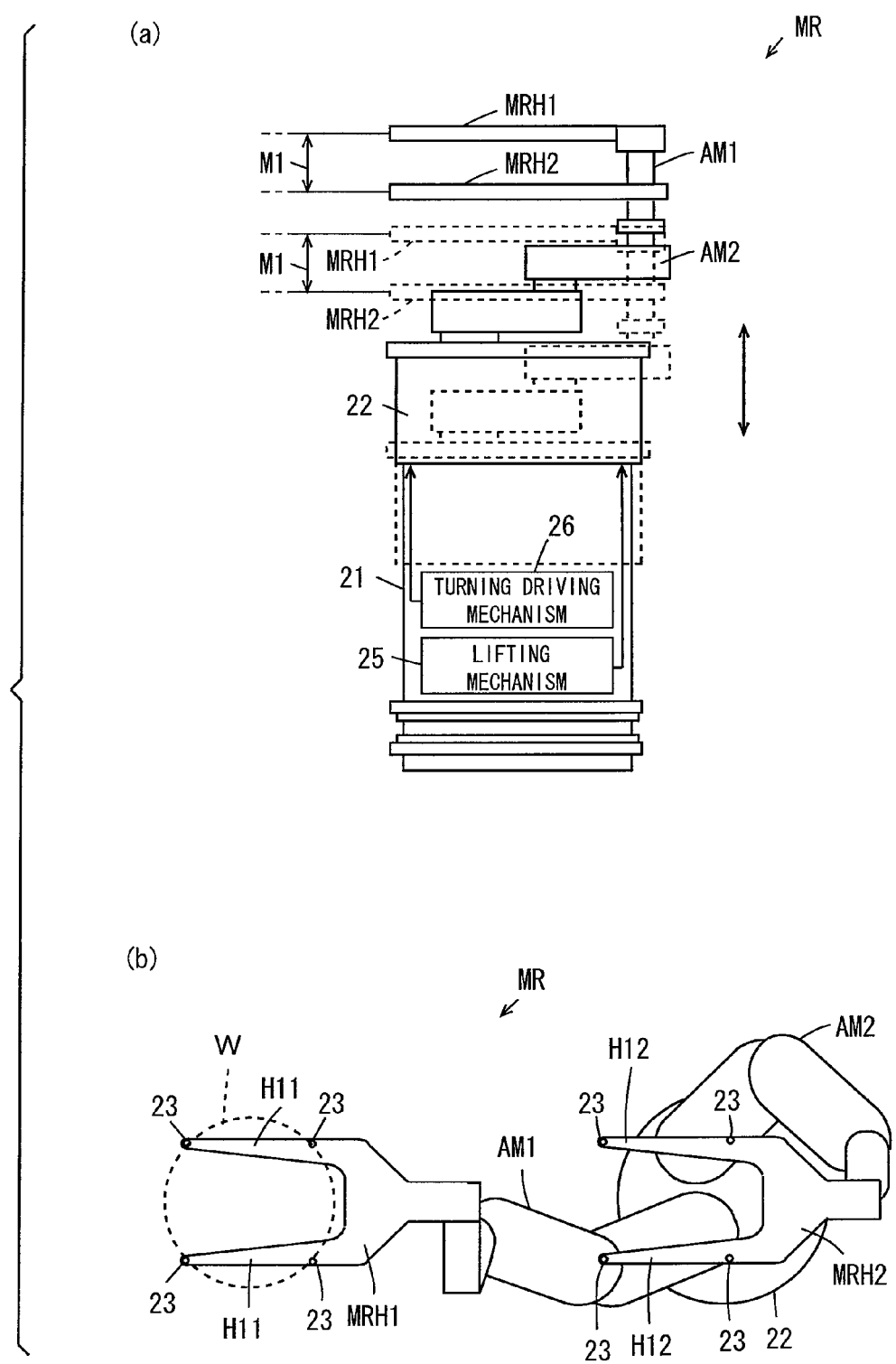
FIG. 3(a) is a side view of a main robot.
FIG. 3(b) is a plan view of the main robot.

According to the embodiment, when the first movable plate 36a and the second movable plate 36b are most apart from the fixed plate 32 and the distance M2 between the first movable plate 36a and the fixed plate 32 and the distance M3 between the second movable plate 36b and the fixed plate 32 are set to be substantially equal to the difference M1 in height between the hand MRH1 and the hand MRH2 of the main robot MR shown in FIG. 3.

The rotary actuator 38 rotates the supporting plate 31 around the horizontal axis HA. In this way, the first movable plate 36a, the second movable plate 36b, and the fixed plate 32 coupled to the supporting plate 31 rotate around the horizontal axis HA.

As shown in FIG. 4(b), the first movable plate 36a, the fixed plate 32, and the second movable plate 36b have substantially the same shape.

The first movable plate 36a has a central supporter 361a extending along the support plate 35a and side portions 362a and 363a extending parallel to the central supporter 361a on the both sides of the central supporter 361a. The side portions 362a and 363a are provided symmetrically with each other with respect to the central supporter 361a. The central supporter 361a and the side portions 362a and 363a are coupled with one another at one ends close to the supporting plate 31 (FIG. 4(a)). In this way, the first movable plate 36a has a substantially E shape, and stripe-shaped slit regions are formed between the central supporter 361a and the side portions 362a and 363a.

The fixed plate 32 has a central supporter 321 and side portions 322 and 323 that correspond to the central supporter 361a and side portions 362a and 363a of the first movable plate 36a, and they are coupled with one another at one ends close to the supporting plate 31. In this way, the fixed plate 32 has a substantially E shape and stripe-shaped slit regions are formed between the central supporter 321 and the side portions 322 and 323.

The second movable plate 36b has a central supporter 361b and side portions 362b and 363b that correspond to the central supporter 361a and side portions 362a and 363a of the first movable plate 36a and they are coupled to one another at one ends close to the supporting plate 31. In this way, the second movable plate 36b has a substantially E shape and stripe-shaped slit regions are formed between the central supporter 361a and side portions 362b and 363b.

As shown in FIG. 4(a), a plurality of support pins 39a are provided on one surface of the fixed plate 32 facing the first moving plate 36a and a plurality of support pins 39b are provided on the other surface. A plurality of support pins 39c are provided on one surface of the first movable plate 36a facing the fixed plate 32 and a plurality of support pins 39d are provided on one surface of the second movable plate 36b facing the fixed plate 32.

According to the embodiment, six of each of support pins 39a, 39b, 39c, and 39d are provided. The support pins 39a, 39b, 39c, and 39d are along the outer circumference of substrates W carried into the reversing units RT1 and RT2. The support pins 39a, 39b, 39c, and 39d have the same length. Therefore, the distance between the tip end of each support pin 39a and the tip end of each support pin 39d and the distance between the tip end of each support pin 39b and the tip end of each support pin 39c are substantially equal to the difference M1 in height between the hands MRH1 and MRH2 of the main robot MR shown in FIG. 3 while the first movable plate 36a and the second movable plate 36b are most apart from the fixed plate 32.

Note that the distance M2 between the first movable plate 36a and the fixed plate 32 and the distance M3 between the second movable plate 36b and the fixed plate 32 may be changed as required. Note however that the distance between the tip end of each support pin 39c and the tip end of each support pin 39d while the first movable plate 36a and the second movable plate 36b are most apart from the fixed plate 32 is set to be greater than the difference M1 in height between the hands MRH1 and MRH2.

(1-5) Operation of Reversing Units

Figure 5:
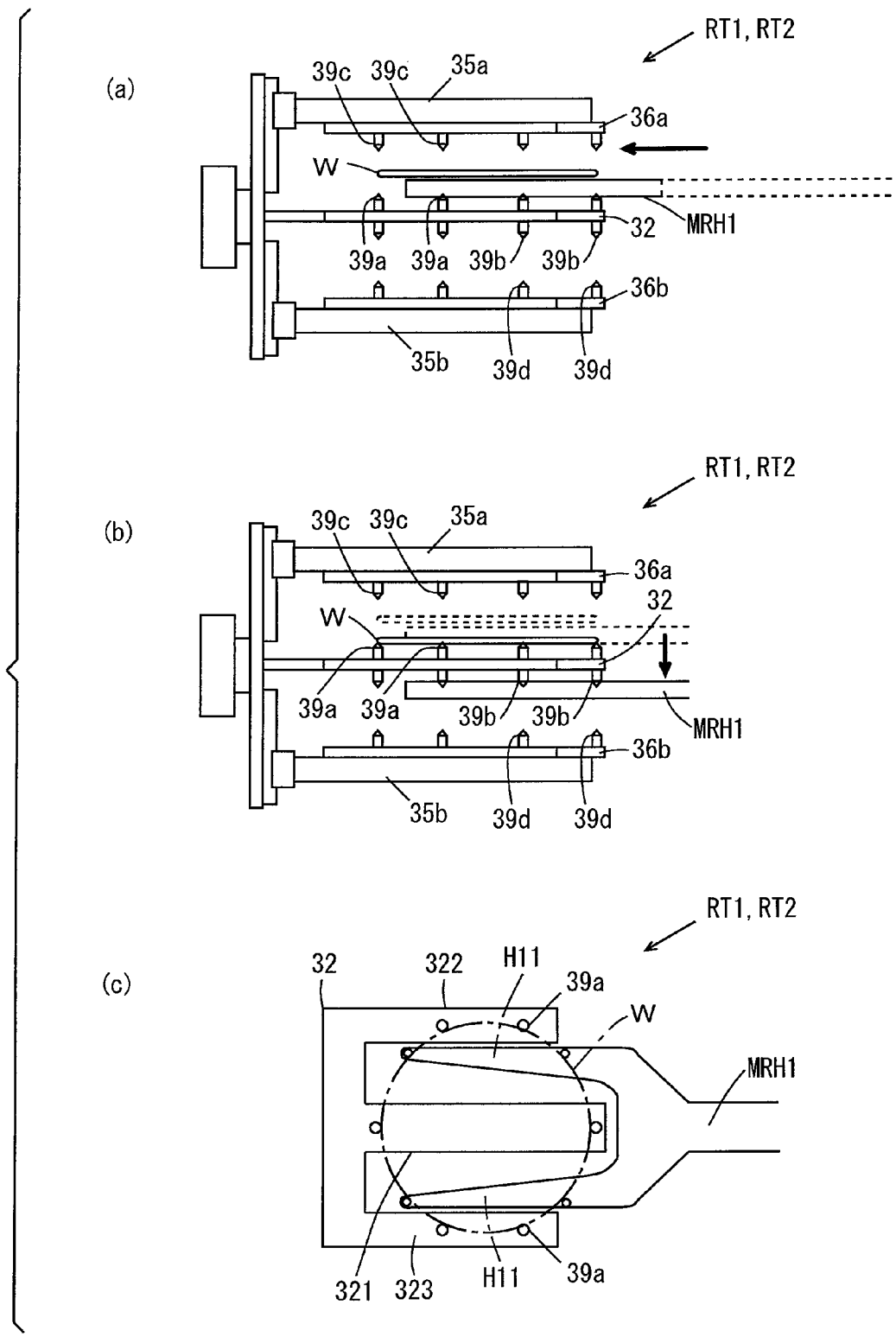
FIGS. 5 to 7 are views for use in illustrating the operation of the reversing units.
Figure 6:
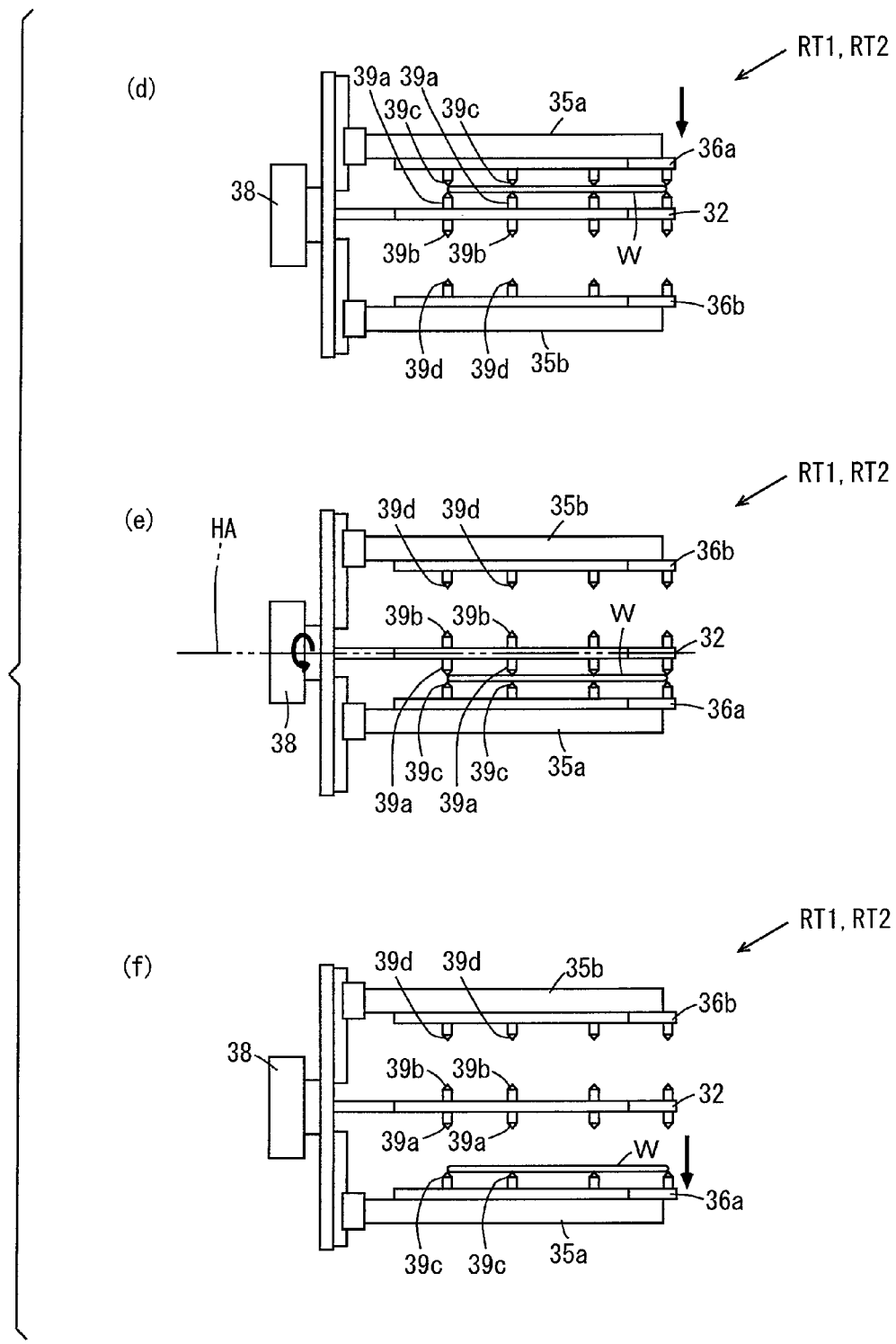
Figure 7:
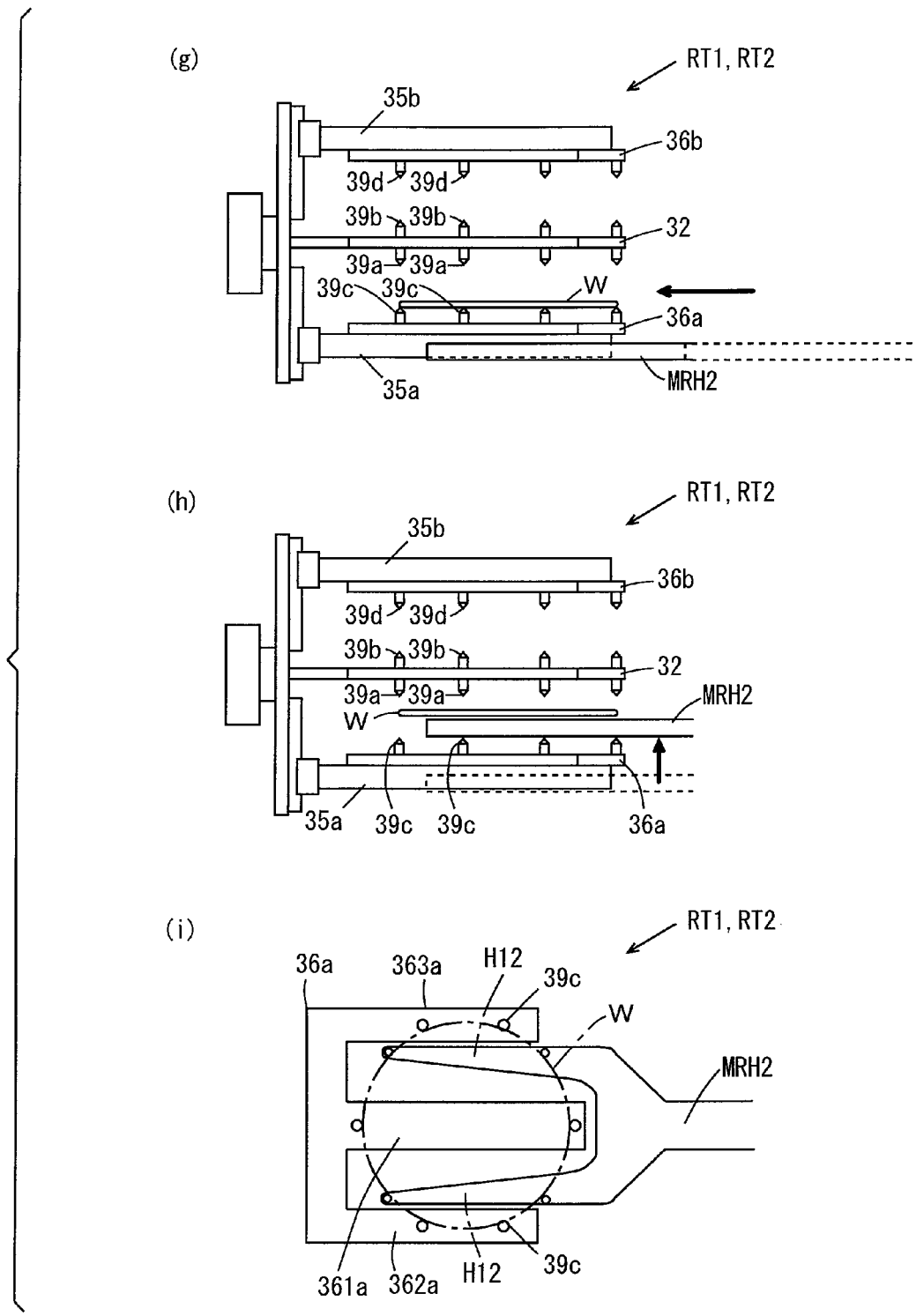

Now, the operation of the reversing units RT1 and RT2 will be described. FIGS. 5 to 7 are views for use in illustrating the operation of the reversing units RT1 and RT2. Note that substrates W are carried into the reversing units RT1 and RT2 as described above by the hand MRH1 of the main robot MR, and substrates W are carried out from the reversing units RT1 and RT2 by the hand MRH2 of the main robot MR.

As shown in FIG. 5(a), while the first movable plate 36a, the fixed plate 32, and the second movable plate 36b are kept in a horizontal posture, the hand MRH1 of the main robot MR holding the substrate W advances between the first movable plate 36a and the fixed plate 32. Then, as shown in FIG. 5(b), the hand MRH1 is lowered. In this case, as shown in FIG. 5(c), the claws H11 of the hand MRH1 are lowered through the slit regions between the central supporter 321 and the side portions 322 and 323 of the fixed plate 32. In this way, the substrate W held by the hand MRH1 is placed on the support pins 39a of the fixed plate 32.

Note that the substrate W having its back surface directed upward is placed on the support pins 39a in the reversing unit RT1, while the substrate W having its top surface directed upward is placed on the support pins 39a in the reversing unit RT2.

Then, as shown in FIG. 6(d), the supporting member 35a is lowered by the cylinder 37a (FIG. 4(a)). In this way, the first movable plate 36a is lowered, so that the distance between the first movable plate 36a and the fixed plate 32 is shortened. Once the first movable plate 36a is lowered for a prescribed distance, the peripheral portion and the outer edge of the substrate W is held by the support pins 39a of the fixed plate 32 and the support pins 39c of the first movable portion 36a. In this state, as shown in FIG. 6(e), the first movable plate 36a, the fixed plate 32 and the second movable plate 36b are integrally rotated 180° around the horizontal axis HA by the rotary actuator 38. Therefore, the substrate W supported by the support pins 39a and support pins 39c are reversed. In this way, the substrate W has its top surface directed upward in the reversing unit RT1, while the substrate W has its back surface directed upward in the reversing unit RT2.

Then, as shown in FIG. 6(f), the supporting member 35a is lowered by the cylinder 37a. In this way, the first movable plate 36a is lowered, so that the distance between the first movable plate 36a and the fixed plate 32 increases. Therefore, the substrate W is supported by the support pins 39c of the first movable plate 36a.

In this state, as shown in FIG. 7(g), the hand MRH2 of the main robot MR advances under the first movable plate 36a. Then, as shown in FIG. 7(h), the hand MRH2 is lifted. In this case, as shown in FIG. 7(i), the claws H12 of the MRH2 are lifted through the slit regions between the central supporter 361a and the side portions 362a and 363a of the first movable plate 36a. In this way, the substrate W is received by the hand MRH2. Then, the hand MRH2 withdraws from the reversing units RT1 and RT2, so that the substrate W is carried out from the reversing units RT1 and RT2.

Note that in FIGS. 5 to 7, a substrate W is carried in while the first movable plate 36a is placed above the fixed plate 32, and a substrate W is carried out while the second movable plate 36b is placed above the fixed plate 32. However, after the substrate W is carried out while the second movable plate 36b is placed above the fixed plate 32, a substrate W is carried in while the second movable plate 36b is placed above the fixed plate 32 and a substrate W is carried out while the first movable plate 36a is placed above the fixed plate 32.

In the case, the second supporting member 35b is lowered by the cylinder 37b, so that the substrate W is held by the support pins 39d of the second movable plate 36b and the support pins 39b of the fixed plate 32. Then, the first movable plate 36a, the fixed plate 32 and the second movable plate 36b are reversed by the rotary actuator 38 in the state, so that the substrate W is reversed. Thereafter, the second supporting member 35b is lowered by the cylinder 37b, which allows the substrate W to be supported by the support pins 39d, so that the substrate W is carried out from the support pins 39d.

(1-6) Carrying in/Out Substrate with Main Robot

Now, the operation of the main robot MR after the substrates W are carried out from the reversing units RT1 and RT2 until new substrates W are carried into the reversing units RT1 and RT2 will be described.

Figure 8:
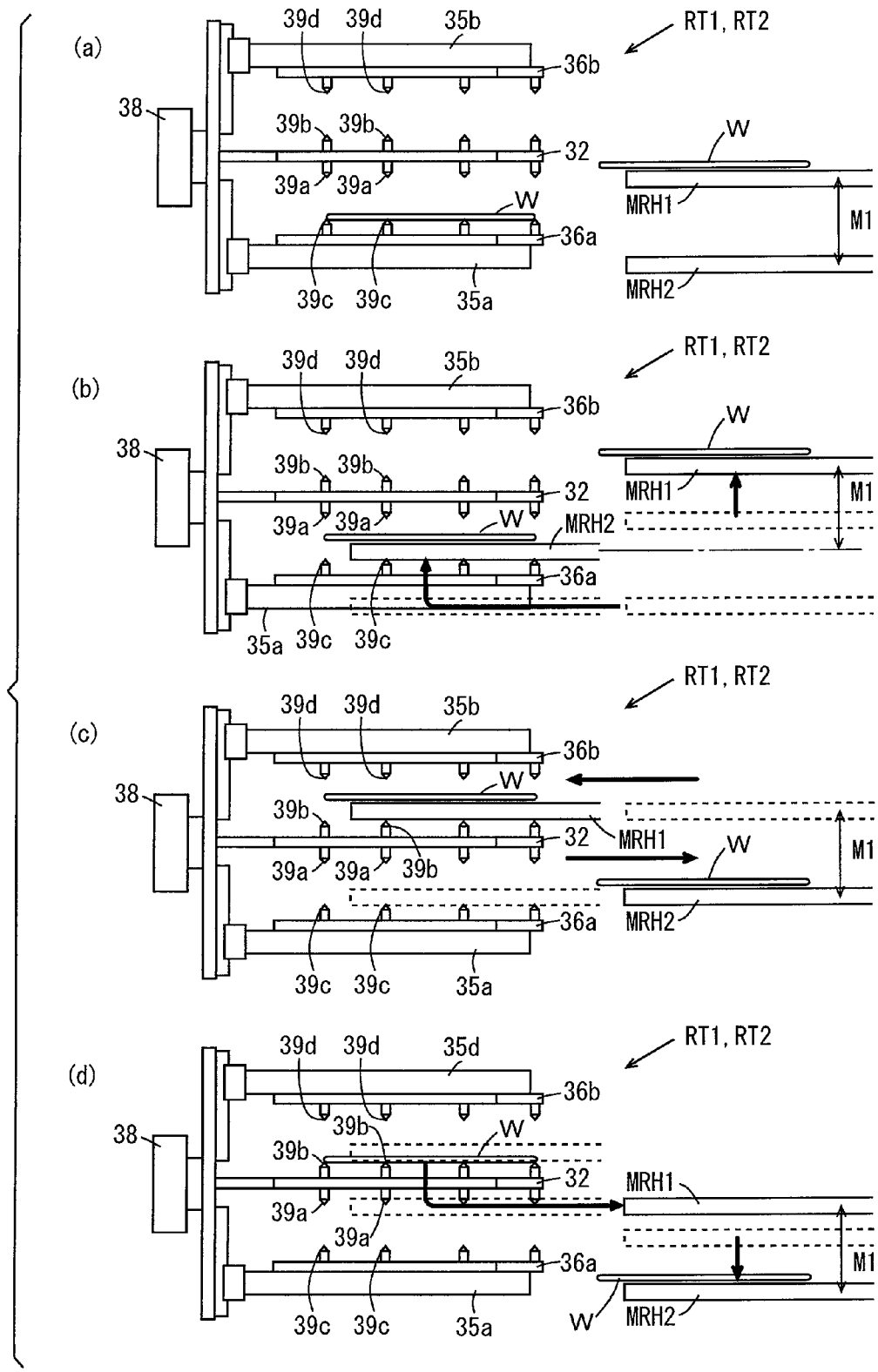
FIG. 8 is a view for use in illustrating the operation of how the main robot carries in/out a substrate W.

FIG. 8 is a view for use in illustrating the operation of how the main robot MR carries in/out a substrate W. As described above, the main robot MR carries a reversed substrate W out from the reversing unit RT1 or RT2 using the hand MRH2 and carries a substrate W to be reversed into the reversing unit RT1 or RT2 using the hand MRH1. Therefore, immediately before the substrate W is carried into/out from the reversing unit RT1 or RT2, the hand MRH1 of the main robot MR holds the substrate W to be reversed while the hand MRH2 holds no substrate W as shown in FIG. 8(a).

As shown in FIG. 8(b), as the hand MRH2 is lifted as it advances, the substrate W on the support pins 39c is received by the hand MRH2. At the time, the difference M1 in height between the hand MRH1 and the hand MRH2 is kept constant, so that the hand MRH1 is also lifted as the hand MRH2 is lifted.

Then, as shown in FIG. 8(c), while the heights of the hands MRH1 and MRH2 are maintained, as the hand MRH2 withdraws, the hand MRH1 advances. Here, according to the embodiment, the distance M2 (FIG. 4) between the second movable plate 36b and the fixed plate 32 and the distance M3 (FIG. 4) between the second movable plate 36b and the fixed plate 32 are substantially equal to the difference M1 in height between the hands MRH1 and MRH2. Therefore, when the hand MRH2 is at such a height to be located between the first movable plate 36a and the fixed plate 32, the hand MRH1 is at such a height to be located between the second movable plate 36b and the fixed plate 32. The hand MRH1 therefore advances to move between the second movable plate 36b and the fixed plate 32.

Then, as shown in FIG. 8(d), the hand MRH1 is lowered and withdraws. In this way, the substrate W is placed on the support pins 39b. At the time, the hand MRH2 is lowered as the hand MRH1 is lowered.

In this manner, the substrates W are carried in/out from the reversing unit RT1 or RT2 by the main robot MR. Then, the reversing unit RT1 or RT2 reverses a substrate W newly carried in. More specifically, substrates W are carried into and out from the reversing unit RT1 or RT2 in a state in which the first movable plate 36a is placed above the fixed plate 32 and in a state in which the second moving plate 36b is placed above the fixed plate 32.

(1-7) Details of Back Surface Cleaning Unit

Figure 9:
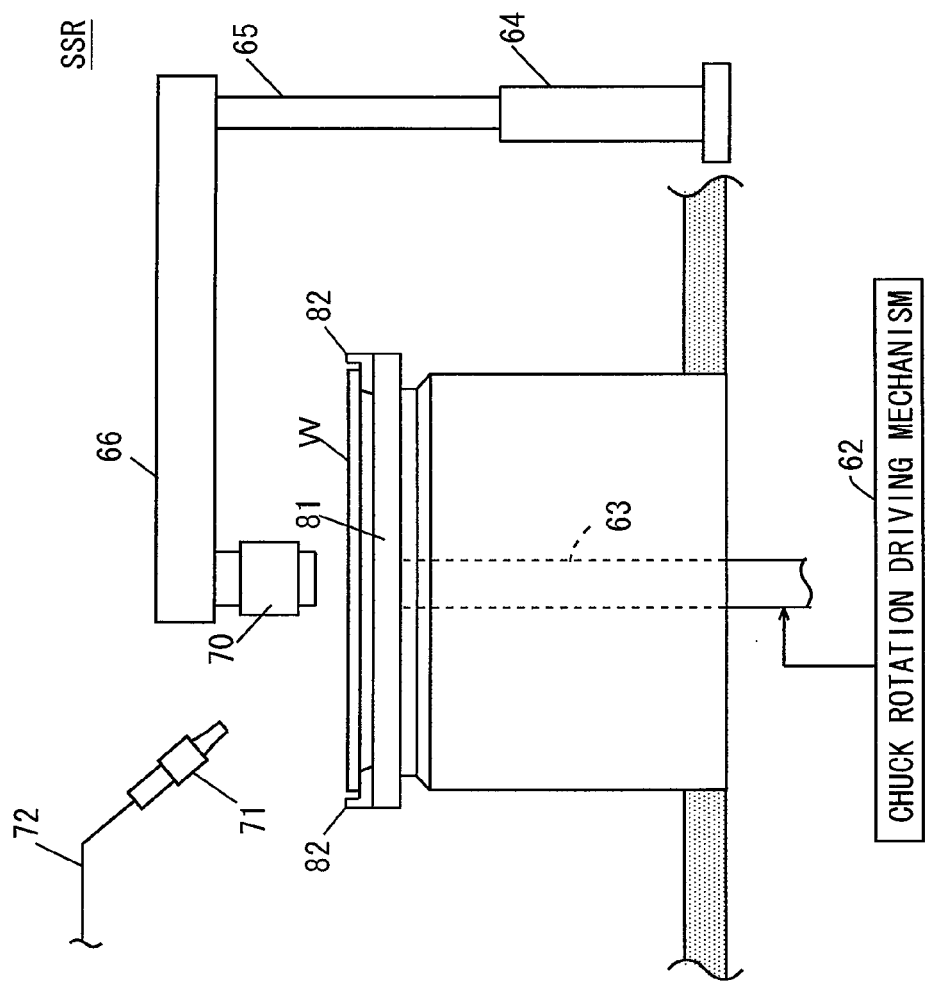
FIG. 9 is a view for use in illustrating the configuration of a back surface cleaning unit.

Now, the back surface cleaning unit SSR shown in FIG. 1 will be described. FIG. 9 is a view for use in illustrating the configuration of the back surface cleaning unit SSR. The back surface cleaning unit SSR shown in FIG. 9 carries out cleaning processing to a substrate W using a brush (hereinafter referred to as "scrub cleaning processing").

With reference to FIG. 9, the back surface cleaning unit SSR will be described in detail. As shown in FIG. 9, the back surface cleaning unit SSR includes a mechanical spin chuck 81 that holds a substrate W horizontally and rotates the substrate W around the vertical axis passing the center of the substrate W. The spin chuck 81 holds the outer edge of the substrate W. The spin chuck 81 is fixed at the upper end of a rotating shaft 63 rotated by a chuck rotation driving mechanism 62.

As described above, a substrate W having its back surface directed upward is carried into the back surface cleaning unit SSR. Therefore, the substrate W is held by the spin chuck 81 while its back surface is directed upward. When the scrub cleaning processing and the rinsing processing are carried out, the substrate W is rotated as its horizontal posture is maintained while the lower circumference and outer edge thereof are held by rotary holding pins 82 on the spin chuck 81.

A motor 64 is provided outside the spin chuck 81. The motor 64 is connected with a rotation shaft 65. The rotation shaft 65 is coupled with a horizontally extending arm 66, and a substantially cylindrical, brush cleaner 70 is provided at the tip end of the arm 66. A liquid discharge nozzle 71 used to supply a cleaning liquid or a rinse liquid (pure water) toward the surface of the substrate W held by the spin chuck 81 is provided above the spin chuck 81. The liquid discharge nozzle 71 is connected with a supply pipe 72, and the cleaning liquid or the rinse liquid is selectively supplied through the supply pipe 72 to the liquid discharge nozzle 71.

During the scrub cleaning processing, the motor 64 rotates the rotation shaft 65. This causes the arm 66 to pivot within a horizontal plane, so that the brush cleaner 70 moves between an outer position of the substrate W and a position above the center of the substrate W around the rotation shaft 65. A lifting mechanism that is not shown is provided at the motor 64. The lifting mechanism lifts and lowers the rotation shaft 65 to allow the brush cleaner 70 to be lowered and lifted in the outer position of the substrate W and the position above the center of the substrate W.

At the start of the scrub cleaning processing, the substrate W having its top surface directed upward is rotated by the spin chuck 81. The cleaning liquid or the rinse liquid is supplied to the liquid discharge nozzle 71 through the supply pipe 72. In this way, the cleaning liquid or the rinse liquid is supplied to the surface of the rotating substrate W. In the state, the brush cleaner 70 is allowed to swing and moved up and down by the rotation shaft 65 and the arm 66. In this way, the scrub cleaning processing is carried out to the surface of the substrate W.

(1-8) Effects of First Embodiment (1-8-a)

The main robot MR rotates 90° to transport a substrate W reversed by the reversing unit RT2 to the back surface cleaning unit SSR. The main robot MR rotates 90° to transport the substrate W processed by the back surface cleaning unit SSR to the reversing unit RT1.

In this way, the main robot MR does not have to rotate more than 90° while it transports substrates W between the units RT1, RT2, and SSR and the substrate platforms PASS1 and PASS2.

Therefore, as compared to the case in which the substrate platforms PASS1 and PASS2 and the reversing units RT1 and RT2 are placed opposite to each other with the main robot MR interposed therebetween, the distance for the main robot MR to transport a substrate W is shortened, so that the time required for transporting the substrate W is reduced.

(1-8-b)

The main robot MR is moved up and down to transport a substrate W placed on the substrate platform PASS2 to the reversing unit RT2 positioned immediately below. The main robot MR is moved up and down to transport a substrate W reversed by the reversing unit RT1 to the substrate platform PASS1 positioned immediately below.

In this way, the main robot MR does not have to rotate in order to transport substrates W between the substrate platform PASS1 or PASS2 and the reversing unit RT1 or RT2. This reduces the time required for transporting a substrate W.

The reversing unit RT1 and the substrate platform PASS1 are placed adjacent to each other in the vertical direction, while the reversing unit RT2 and the substrate platform PASS2 are placed adjacent to each other in the vertical direction. Therefore, the distance for the main robot MR to transport a substrate W is reduced, which further reduces the time required for transporting the substrate W.

(1-8-c)

As described above, in the substrate processing apparatus 100 according to the first embodiment, the throughput in the substrate processing is sufficiently improved.

(1-8-d)

According to the first embodiment, when the hand MRH2 of the main robot MR is withdrawn to carry reversed substrates W out from the reversing unit RT1 or RT2, substrates W to be reversed can be carried into the reversing unit RT1 or RT2 by advancing the hand MRH1 of the main robot MR at the height at present without moving the hand in the vertical direction.

In this case, the hands MRH1 and MRH2 do not have to be adjusted in height during the period after a substrate W is carried out from the reversing unit RT1 or RT2 until a substrate W is carried into the reversing unit RT1 or RT2, so that the substrates W can quickly be carried into and out from the reversing unit RT1 or RT2. In this way, the throughput in the substrate processing apparatus 100 can further be improved.

(1-8-e)

Figure 2:
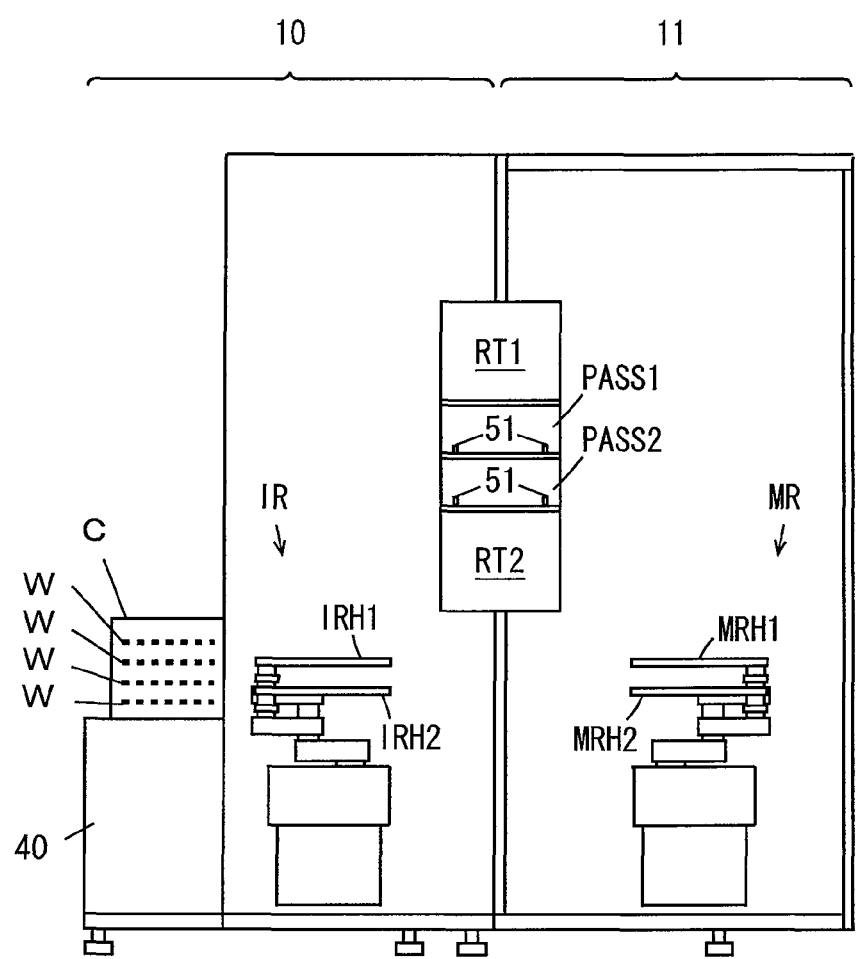
FIG. 2 is a schematic sectional view taken along line A-A in FIG. 1(a)

As shown in FIG. 1, the reversing units RT1 and RT2 are stacked under and above the substrate platforms PASS1 and PASS2, so that the substrate processing apparatus 100 can be reduced in size and the footprint is reduced.

(1-8-f)

According to the first embodiment, the stripe shaped slit regions are provided in the first movable plate 36*a*, the second movable plate 36*b* and the fixed plate 32 of the reversing units RT1 and RT2, so that the hands MRH1 and MRH2 of the main robot MR can move up and down in the vertical direction through the slit regions.

In this case, if the support pins 39*a*, 39*b*, 39*c*, and 39*d* are short, the hands MRH1 and MRH2 are lowered through the slit regions, so that the hands MRH1 and MRH2 can place substrates W on the support pins 39*a*, 39*b*, 39*c*, and 39*d* without being in contact with the first movable plate 36*a*, the second movable plate 36*b*, and the fixed plate 32. In addition, if the support pins 39*a*, 39*b*, 39*c*, and 39*d* are short, the hands MRH1 and MRH2 are lifted through the slit regions, so that hands MRH1 and MRH2 can receive substrates W placed on the support pins 39*a*, 39*b*, 39*c*, and 39*d* without being in contact with the first movable plate 36*a*, the second movable plate 36*b*, and the fixed plate 32. In this manner, the reversing units RT1 and RT2 can be reduced in size.

(1-8-g)

According to the first embodiment, a substrate W held by the reversing unit RT1 has its top surface directed upward when the substrate W is positioned above the horizontal axis HA and has its back surface directed upward when the substrate W is positioned below the horizontal axis HA. The substrate W held by the reversing unit RT2 has its back surface directed upward when the substrate W is positioned above the horizontal axis HA and has its top surface directed upward when the substrate W is positioned below the horizontal axis HA.

Therefore, it can be determined which surface of a substrate W is directed upward based on whether the substrate W is positioned above or below the horizontal axis HA. If therefore the operation of the substrate processing apparatus 100 stops because of power failure for example, it can be determined instantaneously which surface of the substrates W held by the reversing units RT1 and RT2 are directed upward.

(2) Second Embodiment

Now, a substrate processing apparatus according to a second embodiment of the invention will be described with reference to its difference from the first embodiment.

(2-1) Configuration of Substrate Processing Apparatus

Figure 10:
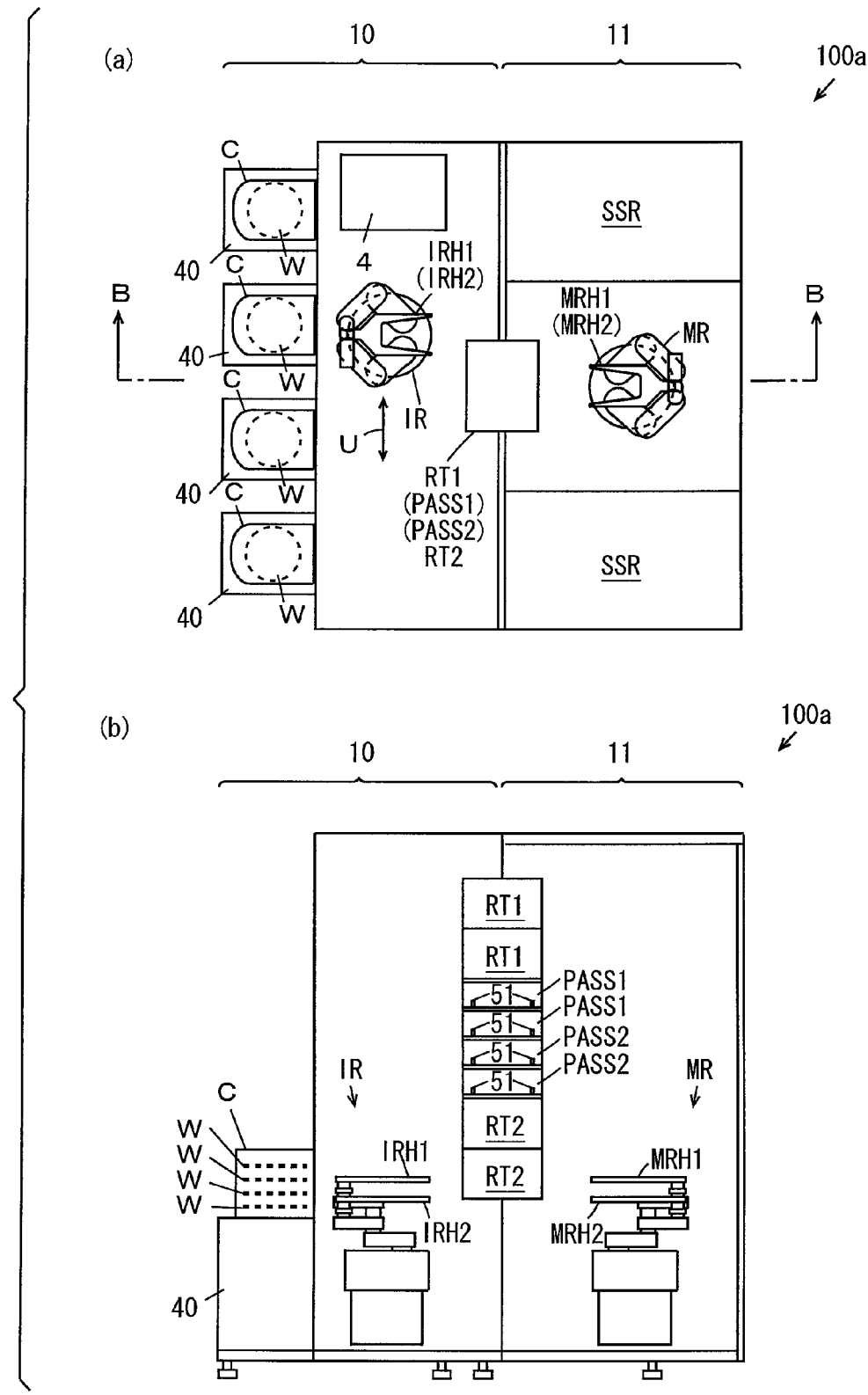
FIG. 10(a) is a plan view of a substrate processing apparatus according to a second embodiment of the invention.
FIG. 10(b) is a schematic sectional view taken along line B-B in FIG. 10(a)

FIG. 10(*a*) is a plan view of a substrate processing apparatus according to the second embodiment of the invention, and FIG. 10(*b*) is a schematic sectional view taken along line B-B in FIG. 10(*a*). As shown in FIGS. 10(*a*) and 10(*b*), the substrate processing apparatus 100*a* according to the second embodiment includes two of each of reversing units RT1 and RT2 and two of each of substrate platforms PASS1 and PASS2. The two reversing units RT1 and the two substrate platforms PASS1 are adjacent to each other in the vertical direction, and the two reversing units RT2 and the two substrate platforms PASS2 are adjacent to each other in the vertical direction.

(2-2) Operation of Main Robot

With reference to FIG. 10, general operation of a main robot MR according to the second embodiment will be described.

To start with, substrates W are placed on the two substrate platforms PASS2 in advance by an indexer robot IR as described in connection with the first embodiment. The main robot MR receives the unprocessed substrates W from the two substrate platforms PASS2 by hands MRH1 and MRH2, respectively.

Then, the main robot MR carries the two substrates W held by the hands MRH1 and MRH2 into one of the reversing units RT2. The main robot MR carries two substrates W having their back surfaces directed upward out from the other of the reversing units RT2 by the hands MRH1 and MRH2.

Then, the main robot MR sequentially carries the two substrates W held by the hands MRH1 and MRH2 into two back surface cleaning units SSR. The main robot MR sequentially carries the two substrates W after back surface cleaning processing out from the two back surface cleaning units SSR.

Then, the main robot MR carries the two substrates W held by the hands MRH1 and MRH2 into one of the reversing units RT1. Then, the main robot MR carries the two substrates W having their top surfaces directed upward out from the other of the reversing units RT1 by the hands MRH1 and MRH2. The main robot MR then places the two substrates W held by the hands MRH1 and MRH2 on the two substrate platforms PASS1. The main robot MR continuously carries out the series of operation.

(2-3) Operation of Reversing Units

Figure 11:
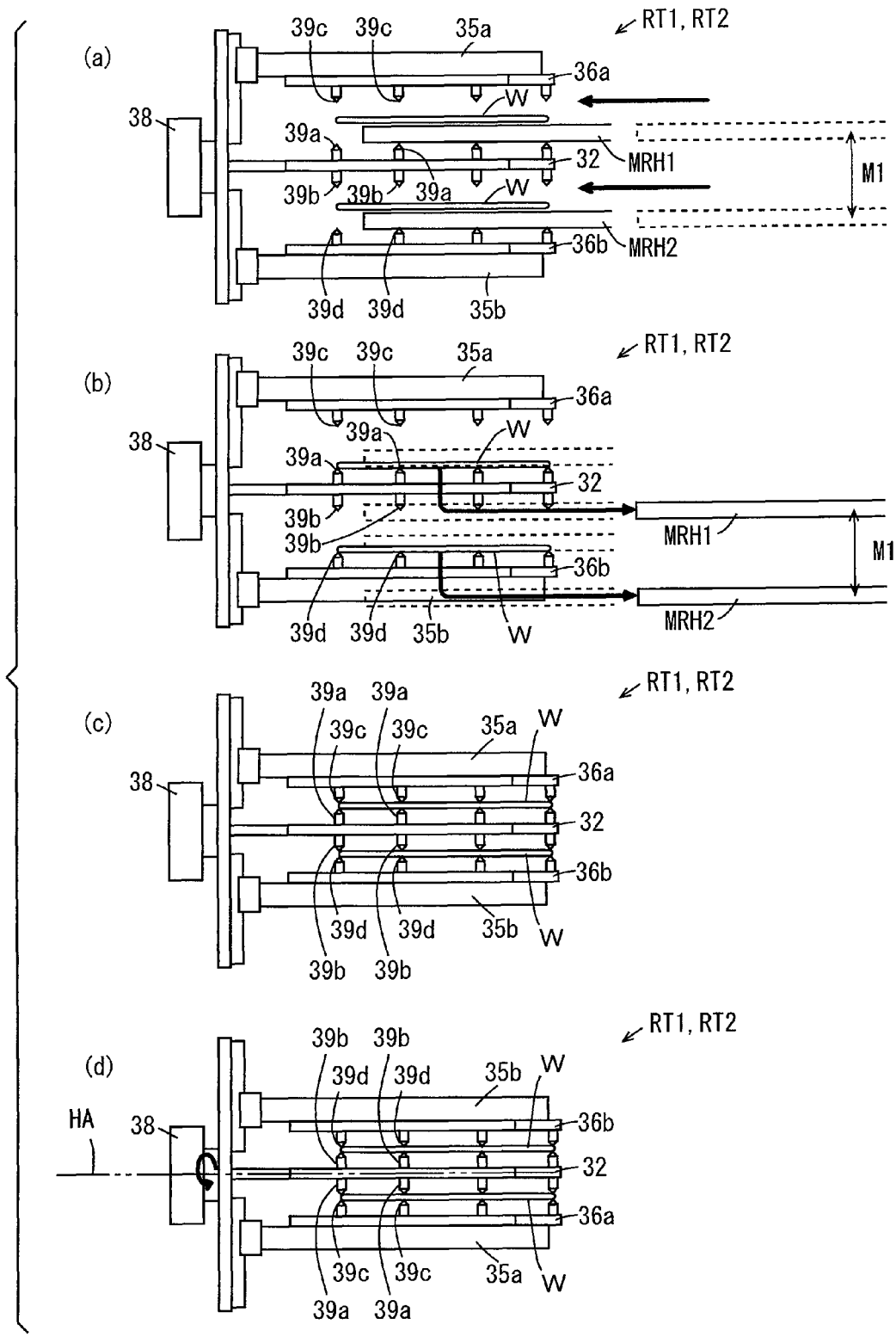
FIGS. 11 and 12 are views for use in illustrating the operation of reversing units.
Figure 12:
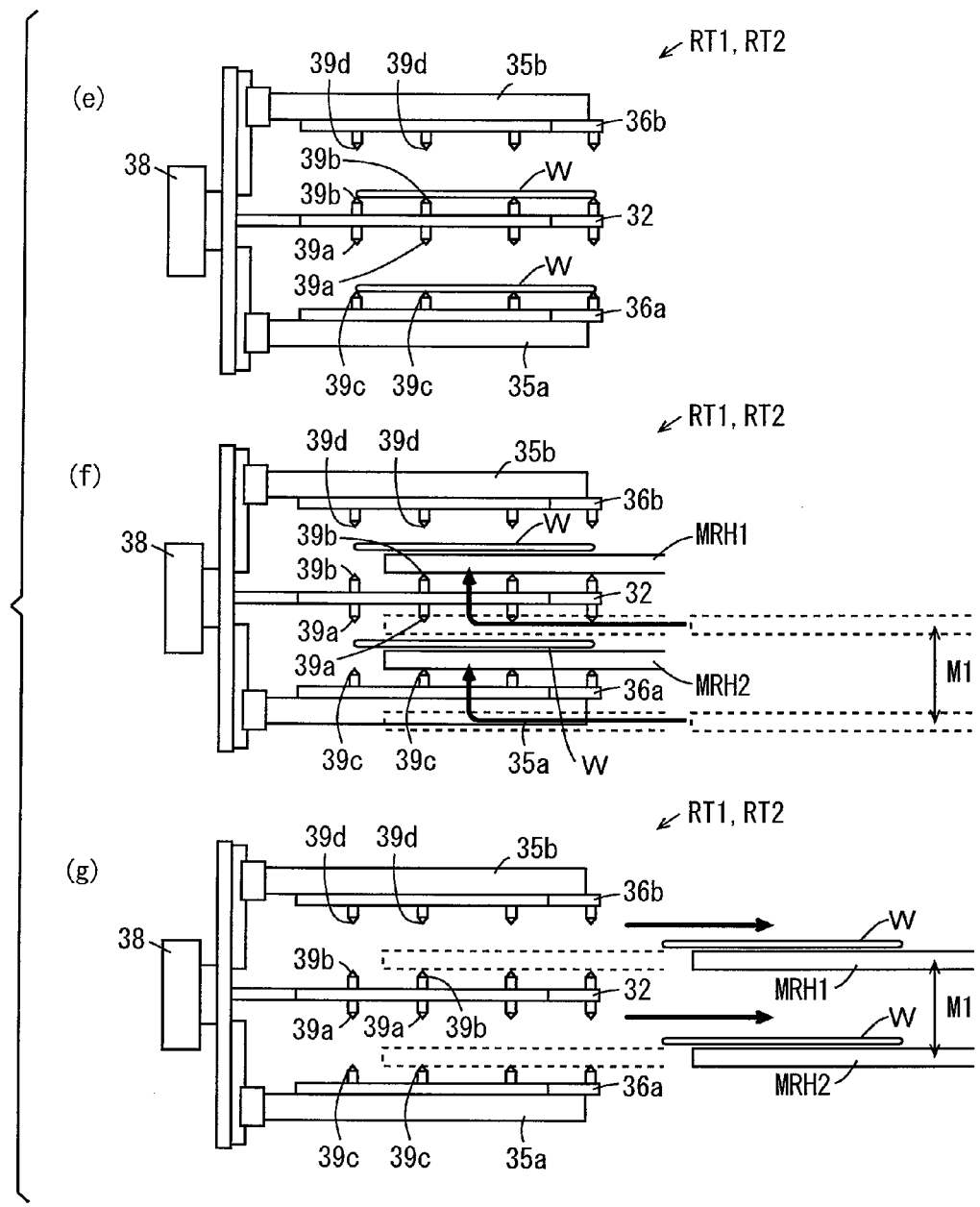

Now, the operation of the reversing units RT1 and RT2 will be described. FIGS. 11 and 12 are views for use in illustrating the operation of the reversing units RT1 and RT2. As shown in FIG. 11(a), the hands MRH1 and MRH2 holding substrates W between the first movable plate 36a and the fixed plate 32 and between the second movable plate 36b and the fixed plate 32 advance simultaneously. As shown in FIG. 11(b), the hands MRH1 and MRH2 are simultaneously lowered and withdrawn. In this way, the substrates W are placed on the support pins 39a and 39d. In this way, in the reversing unit RT2, the substrates W having their top surfaces directed upward are placed on the support pins 39a and 39d, while in the reversing unit RT1, the substrates W having their back surfaces directed upward are placed on the support pins 39a and 39d.

Then, as shown in FIG. 11(c), the supporting member 35a is lowered by the cylinder 37a (FIG. 4(a)) and the supporting member 35b is lifted by the cylinder 37b (FIG. 4(a)). In this way, one of the substrates W is held by the support pins 39c of the first movable plate 36a and the support pins 39a of the fixed plate 32, while the other substrate W is held by the support pins 39d of the second movable plate 36b and the support pins 39b of the fixed plate 32.

In the state, as shown in FIG. 11(d), the first movable plate 36a, the fixed plate 32 and the second movable plate 36b are integrally rotated 180° around the horizontal axis HA by the rotary actuator 38. Therefore, the substrate W held by the support pins 39a and 39c and the substrate W supported by the support pins 39b and 39d are reversed. In this case, the substrates W have their back surfaces directed upward in the reversing unit RT2 and the substrates W have their top surfaces directed upward in the reversing unit RT1.

Then, as shown in FIG. 12(e), the supporting member 35a is lowered by the cylinder 37a and the supporting member 35b is lifted by the cylinder 37b. In this way, the first movable plate 36a is lowered and the second movable plate 36b is lifted. Therefore, one of the substrates W is held on the support pins 39c of the first movable plate 36a and the other substrate W is supported on the support pins 39b of the fixed plate 32.

In this state, as shown in FIG. 12(f), the hands MRH1 and MRH2 are lifted as they advance under the substrate W held on the support pins 39b and under the substrate W held by the support pins 39c. Therefore, the substrate W held by the support pins 39b is received by the hand MRH1 and the substrate W held by the support pin 39c is received by the hand MRH2. Thereafter, as shown in FIG. 12(g), the two substrates W are carried out from the reversing unit RT1 or RT2 as the hands MRH1 and MRH2 simultaneously withdraw.

(2-4) Effects of Second Embodiment

According to the second embodiment, two substrates W are simultaneously carried into the reversing unit RT1 or RT2 by the hands MRH1 and MRH2 of the main robot MR, so that the reversing unit RT1 or RT2 simultaneously reverse the two substrates W. Then, the two substrates W are simultaneously carried out from the reversing unit RT1 or RT2 by the hands MRH1 and MRH2.

In this way, substrates W can quickly be carried into/out from the reversing unit RT1 or RT2 and a plurality of substrates W can efficiently be reversed. Therefore, the throughput in the substrate processing apparatus 100 can be improved.

(3) Third Embodiment

Now, a substrate processing apparatus according to a third embodiment of the invention will be described with reference to its difference from the substrate processing apparatus according to the first embodiment. The substrate processing apparatus according to the third embodiment includes reversing units RT1a and RT2a that will be described in the following paragraphs instead of the reversing units RT1 and RT2.

Figure 13:
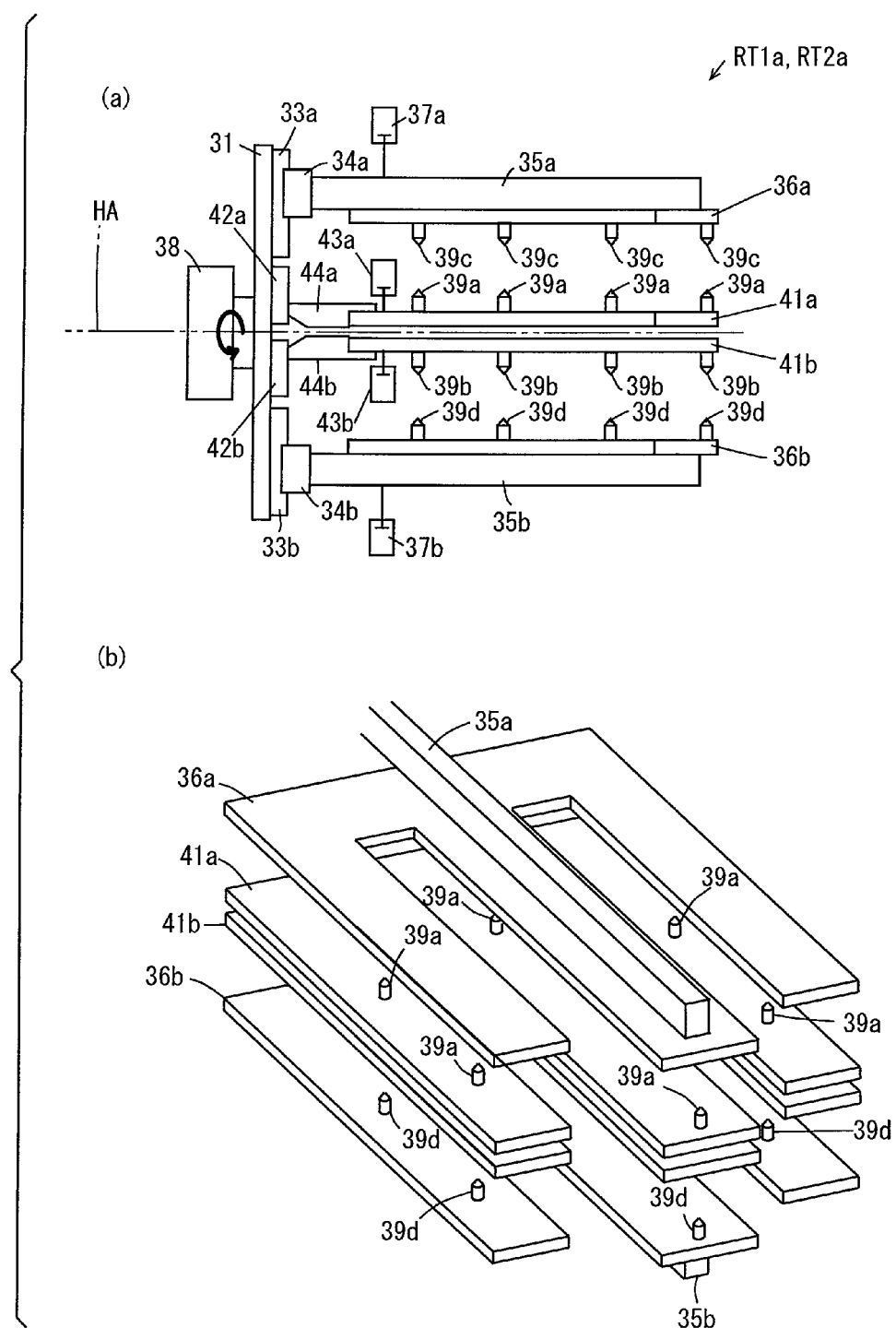
FIG. 13(a) is a side view of the reversing units.
FIG. 13(b) is a perspective view of the reversing units.

FIG. 13(a) is a side view of the reversing unit RT1a or RT2a, and FIG. 13(b) is a perspective view of the reversing unit RT1a or RT2a. With reference to FIGS. 13(a) and 13(b), the difference between the reversing unit RT1a or RT1b and the reversing unit RT1 or RT2 will be described. The reversing units RT1a and RT2a have the same configuration.

As shown in FIGS. 13(a) and 13(b), the reversing unit RT1a or RT2a includes a third movable plate 41a, a fourth movable plate 41b, a pair of linear guides 42a and 42b and a pair of cylinders 43a and 43b instead of the fixed plates 32.

The third movable plate 41a is provided facing the first movable plate 36a and slidably at the liner guide 42a with a coupling member 44a. The fourth movable plate 41b is provided facing the second movable plate 36b and slidably at the liner guide 42b with a coupling member 44b. The third and fourth movable plates 41a and 41b have the same shapes as those of the first movable plates 36a and 36b, respectively.

The linear guides 42a and 42b extend in the direction perpendicular to the third and fourth movable plates 41a and 41b. The third movable plate 41a is moved up and down by the cylinder 43a along the linear guide 42a, while the fourth movable plate 41b is moved up and down by the cylinder 43b along the linear guide 42b. In addition, a plurality of support pins 39a are provided at one surface of the third movable plate 41a facing the first movable plate 36a, while a plurality of support pins 39b are provided at one surface of the fourth movable plate 41b facing the second movable plate 36b.

Note that the distances between the first movable plate 36a, the second movable plate 36b, the third movable plate 41a and the fourth movable plate 41b may be set as desired within the range in which the distance between tip ends of the support pins 39c and the tip ends of the support pins 39d is greater than the difference M1 in height between the hand MRH1 and the hand MRH2 and the distance between the tip ends of the support pins 39a and the tip ends of the support pins 39b is smaller than the difference M1 in height between the hands MRH1 and MRH2 when the third movable plate 41a and the second movable plate 36b are most apart and the fourth movable plate 41b and the first movable plate 36a are most apart.

In the reversing unit RT1a or RT2a, when a substrate W carried in is held between the first movable plate 36a and the third movable plate 41a, the first movable plate 36a and the third movable plate 41a are lowered/lifted to be close to each other by the cylinders 37a and 43a. In this way, the substrate W is held on the support pins 39a and 39c. When the substrate W is released from the state in which it is held by the support pins 39a and 39c, the first movable plate 36a and the third movable plate 41a are moved up and down to be away from each other by the cylinders 37a and 43a.

When a substrate W carried in is held between the second movable plate 36b and the fourth movable plate 41b, the second movable plate 36b and the fourth movable plate 41b are moved up and down to be close to each other by the cylinders 37b and 43b. In this way, the substrate W is held by the support pins 39b and 39d. When the substrate W is released from the state in which it is held by the support pins 39b and 39d, the second movable plate 36b and the fourth movable plate 41b are lowered/lifted to be away from each other by the cylinders 37b and 43b.

According to the third embodiment, when the hand MRH2 of the main robot MR is withdrawn to carry the reversed substrate W out from the reversing unit RT1a or RT2a, a substrate W to be reversed can be carried into the reversing unit RT1a or RT2a by advancing the hand MRH1 of the main robot MR at the height at present without moving the hand in the vertical direction, as with the case with the first embodiment.

In this way, the hands MRH1 and MRH2 do not have to be adjusted in height during the period after a substrate W is carried out from the reversing unit RT1a or RT2a until the substrate W is carried into the reversing unit RT1a or RT2a. Therefore, the substrates W can quickly be carried into or out from the reversing unit RT1a or RT2a. Consequently, the throughput in the substrate processing apparatus 100 can further be improved.

According to the third embodiment, the first movable plate 36a, the second movable plate 36b, the third movable plate 41a and the fourth movable plate 41b can be driven independently, and therefore the distance between the position to hold a substrate W by the support pins 39a and 39c and the position to hold a substrate W by the support pins 39b and 39d can be adjusted arbitrarily.

Note that in the second embodiment described above, the reversing units RT1a and RT2a may be used instead of the reversing units RT1 and RT2.

(4) Fourth Embodiment

A substrate processing apparatus according to a fourth embodiment of the invention will be described with reference to its difference from the substrate processing apparatus according to the first embodiment.

(4-1) Configuration of Substrate Processing Apparatus

Figure 14:
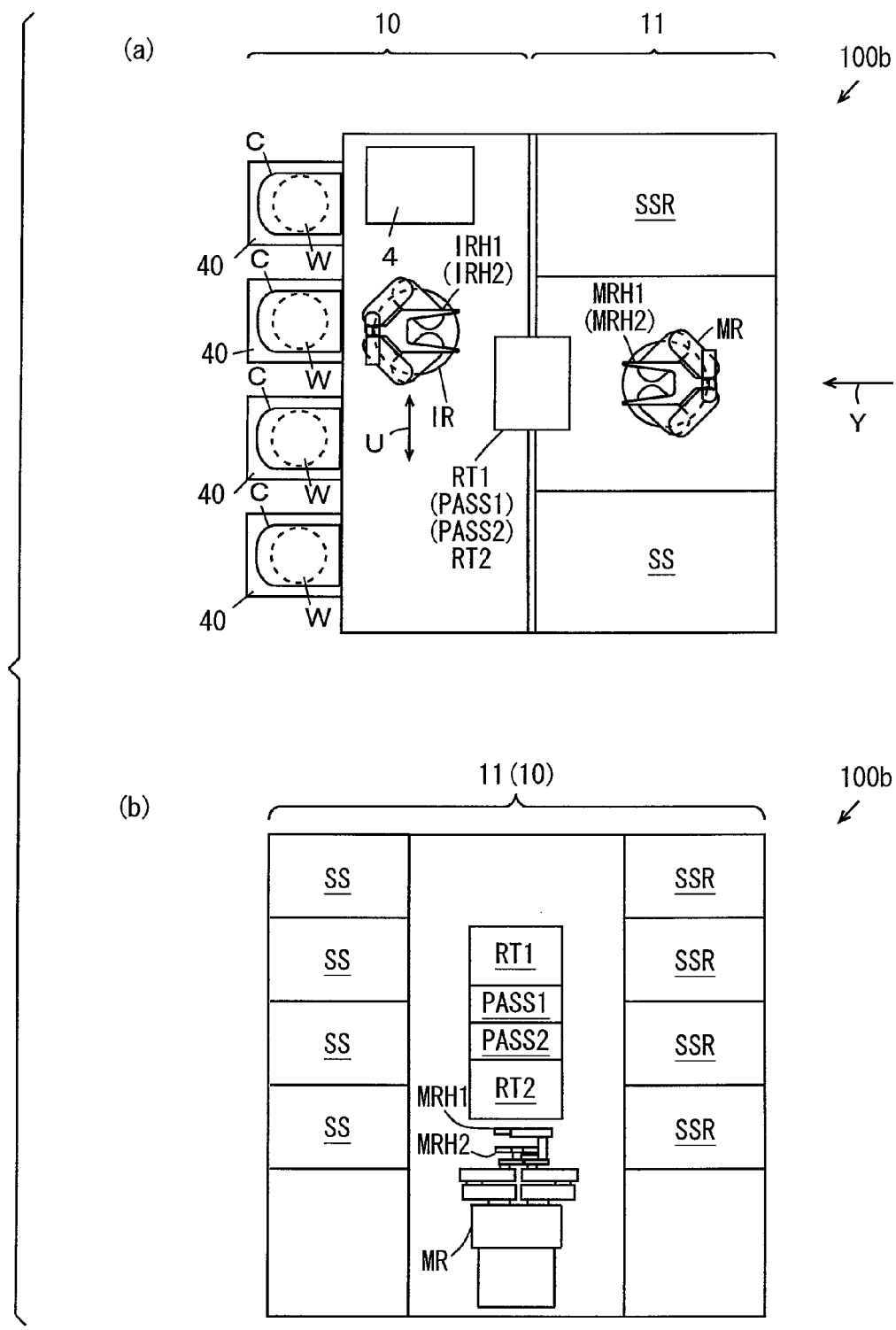
FIG. 14(a) is a plan view of a substrate processing apparatus according to a fourth embodiment of the invention.
FIG. 14(b) is a schematic side view of the substrate processing apparatus in FIG. 14(a) viewed in the direction of arrow Y.

FIG. 14(a) is a plan view of a substrate processing apparatus according to the fourth embodiment of the invention, and FIG. 14(b) is a schematic side view of the substrate processing apparatus in FIG. 14(a) viewed in the direction of arrow Y. As shown in FIGS. 14(a) and 14(b), in the substrate processing apparatus 100b according to the fourth embodiment, a processing block 11 includes a plurality of (four in this example) top surface cleaning units SS, a plurality of (four in this example) back surface cleaning units SSR and a main robot MR. The top surface cleaning unit SS will later be described in detail.

The plurality of top surface cleaning units SS are provided in a stacked manner in the vertical direction on one side of the processing block 11. The plurality of back surface cleaning units SSR are provided in a stacked manner in the vertical direction on the other side of the processing block 11 as with the first embodiment.

(4-2) Operation of Main Robot

With reference to FIG. 10, the operation of a main robot MR according to the fourth embodiment will be described. To start with, the main robot MR receives an unprocessed substrate W from a substrate platform PASS2 by a hand MRH2. The substrate W received by the hand MRH2 at the time has its top surface directed upward.

Then, the main robot MR rotates 90° and is moved up and down. Then, the main robot MR carries the substrate W held by the hand MRH2 and having its top surface directed upward into one of the top surface cleaning units SS.

The main robot MR is then moved up and down. The main robot MR carries a substrate W after top cleaning processing out from one of the top surface cleaning units SS by the hand MRH1.

Then, the main robot MR rotates 90° in the direction opposite to the immediately previous rotating direction and is moved up and down. Then, the robot MR carries the substrate W held by the hand MRH1 into the reversing units RT2. Then, the main robot MR carries a substrate W having its back surface directed upward out from the reversing unit RT2 by the hand MRH2.

The main robot MR then rotates 90° and is moved up and down. The main robot MR then carries the substrate W held by the hand MRH2 and having its back surface directed upward into one of the back surface cleaning units SSR. The main robot MR then carries a substrate W after back surface cleaning processing out from one of the back surface cleaning units SSR by the hand MRH1.

The main robot MR then rotates 90° in the direction opposite to the immediately previous rotating direction and is moved up and down. The main robot MR then carries the substrate W held by the hand MRH1 into the reversing unit RT1. The main robot MR then carries a substrate W having its top surface directed upward from the reversing unit RT1 by the hand MRH2.

The main robot MR is then moved up and down. The main robot MR places the substrate W held by the hand MRH2 on the substrate platform PASS1 and receives an unprocessed substrate W again from the substrate platform PASS2 by the hand MRH1. The main robot MR continuously carries out the series of operation.

(4-3) Details of Top Surface Cleaning Unit

Figure 15:
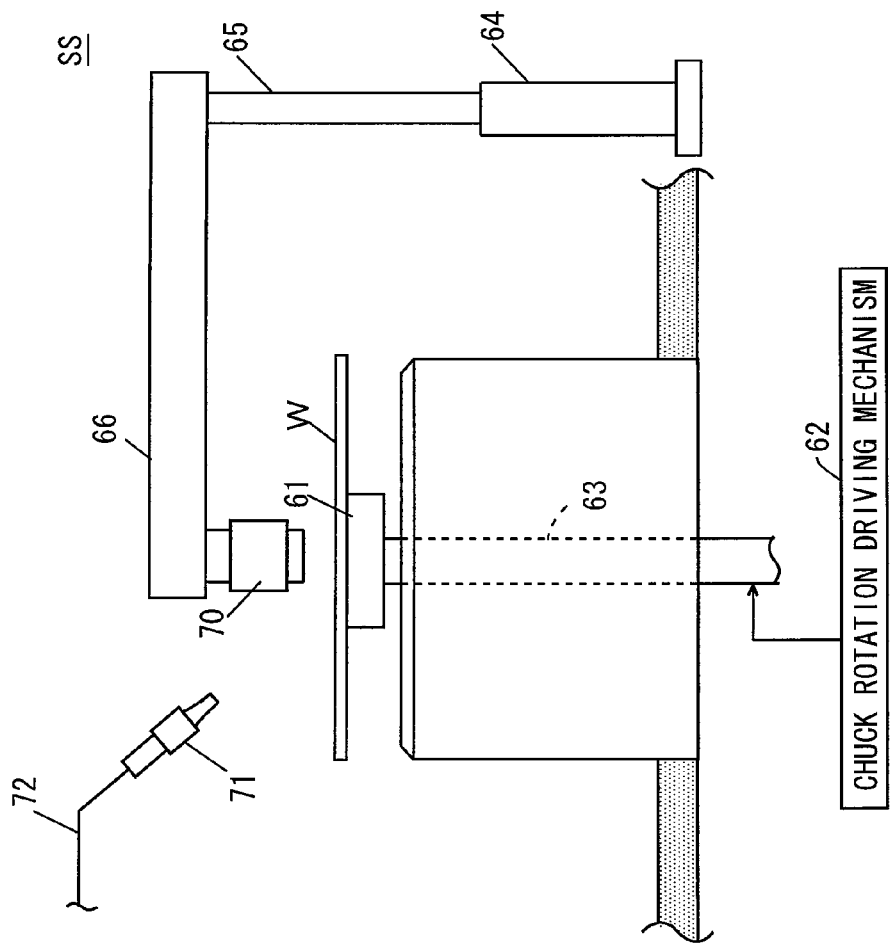
FIG. 15 is a view for use in illustrating the configuration of a top surface cleaning unit.

Now, with reference to FIG. 15, the top surface cleaning unit SS will be described based on its difference from the back surface cleaning unit SSR shown in FIG. 9. FIG. 15 is a view for use in illustrating the configuration of the top surface cleaning unit SS. The scrub cleaning processing is carried out also in the top surface cleaning unit SS.

As shown in FIG. 15, the top surface cleaning unit SS includes a suction type spin chuck 61 that holds the lower surface of a substrate W by vacuum suction instead of the mechanical type spin chuck 81 that holds the outer edge of a substrate W.

The spin chuck 61 is fixed on the upper end of the rotation shaft 63 rotated by a chuck rotation mechanism 62. During the scrub cleaning processing and the rinsing processing, the spin chuck 61 holds the back surface of a substrate W by suction, and the rotation shaft 63 rotates. In this way, the substrate W is kept in a horizontal posture while it rotates around the vertical axis passing the center of the substrate W.

As described above, a substrate W is carried into the top surface cleaning unit SS as it has its top surface directed upward. Therefore, the substrate W is held by the spin chuck 61 as its top surface is directed upward. Then, the surface of the substrate W is subjected to the same scrub cleaning processing described above. Note that the suction type spin chuck 61 is used in the top surface cleaning unit SS and therefore the peripheral portion as well as the outer edge of the substrate W may be cleaned at the same time.

(4-4) Effects of Fourth Embodiment (4-4-a)

The main robot MR rotates 90° and transports a substrate W received from the substrate platform PASS2 to the top surface cleaning unit SS. The main robot MR rotates 90° and transports a substrate W after processing at the back surface cleaning unit SSR into the reversing unit RT1.

In this way, the main robot MR does not have to rotate more than 90° during the transport of substrates W among the units RT1, RT2, SS, and SSR, and the substrate platforms PASS1 and PASS2.

In this way, as compared to the case in which the substrate platforms PASS1 and PASS2 and the reversing units RT1 and RT2 are provided so as to be opposite to one another with the main robot MR therebetween, the distance for the main robot MR to transport a substrate W is reduced, and the time required for transporting the substrate W is shortened.

(4-4-b)

In the substrate processing apparatus 100b according to the embodiment, the top and back surfaces of a substrate W are cleaned, in other words, the entire surface of the substrate W can be cleaned.

(4-4-c)

The main robot MR is moved up and down to transport a substrate W reversed by the reversing unit RT1 to the adjacent substrate platform PASS1. In this way, the main robot MR does not have to rotate to carry the substrate W between the reversing unit RT1 and the substrate platform PASS1. This shortens the time required for transporting the substrate W.

The reversing unit RT1 and the substrate platform PASS1 are adjacent to each other in the vertical direction. In this way, the distance for the main robot MR to transport a substrate W is shortened, and the time required for transporting the substrate W is more shortened.

(4-4-d)

As described above, also in the substrate processing apparatus 100b according to the fourth embodiment, the throughput in the substrate processing is sufficiently improved.

(5) Other Embodiments

According to the above-described fourth embodiment, the top surface of a substrate W is cleaned and then the back surface of the substrate W is cleaned, while the back surface of the substrate W may be cleaned and then the top surface may be cleaned. In this case, prior to the back surface cleaning processing to a substrate W, the substrate W is reversed by the reversing unit RT2 (or RT2a) so that its back surface is directed upward. Then, after the back surface is cleaned, the substrate W is reversed by the reversing unit RT1 (or RT1a) so that its top surface is directed upward. Thereafter, the substrate W is subjected to the top surface cleaning processing.

According to the first to fourth embodiments, in the top surface cleaning unit SS and the back surface cleaning unit SSR, the top and back surfaces of the substrate W are cleaned using the brush, but the top and back surfaces of the substrate W may be cleaned using a chemical solution.

According to the first, third and fourth embodiments, substrates W are carried into the reversing units RT1 and RT2 (or RT1a and RT2a) using the hand MRH1 of the main robot MR and carried out from the reversing units RT1 and RT2 (or RT1a and RT2a) using the hand MRH2 of the main robot MR, but the hand MRH2 of the main robot MR may be used to carry in substrates W into the reversing units RT1 and RT2 (or RT1a and RT2a) while the hand MRH1 of the main robot MR may be used to carry substrates W out from the reversing units RT1 and RT2 (or RT1a and RT2a).

In this case, in the reversing units RT1 and RT2 (RT1a and RT2a), substrates W before being reversed are held below the horizontal axis HA and reversed substrates W are held above the horizontal axis HA.

According to the first and third embodiments, the main robot MR carries reversed substrates W out from the reversing units RT1 and RT2 (or RT1a and RT2a) and then carries substrates W before being reversed into the reversing units RT1 and RT2 (or RT1a and RT2a), while as described in connection with the fourth embodiment, substrates W before being reversed may be carried into the reversing units RT1 and RT2 (or RT1a and RT2a) and then reversed substrates W may be carried out from the reversing units RT1 and RT2 (or RT1a and RT2a).

In the first, second, and fourth embodiments, the support pins 39a, 39b, 39c, and 39d have the same length, but their lengths may arbitrarily set as far as the distance between tip ends of the support pins 39c and the tip ends of the support pins 39d is greater than the difference M1 in height between the hand MRH1 and the hand MRH2 and the distance between the tip ends of the support pins 39a and the tip ends of the support pins 39b is smaller than the difference M1 in height between the hands MRH1 and MRH2 when the first movable plate 36a and the second movable plate 36b are most apart from the fixed plate 32.

Similarly, according to the third embodiment, the lengths of the support pins 39a, 39b, 39c, and 39d may arbitrarily be set as far as the distance between the tip ends of the support pins 39c and the tip ends of the support pins 39d is greater than the difference M1 in height between the hand MRH1 and the hand MRH2 and the distance between the tip ends of the support pins 39a and the tip ends of the support pins 39b is smaller than the difference M1 in height between the hands MRH1 and MRH2 when the third movable plate 41a and the second movable plate 36b are most apart and the fourth movable plate 41b and the first movable plate 36a are most apart.

According to the first embodiment, the fixed plate 32 is fixed to the supporting plate 31 and the first movable plate 36a and the second movable plate 36b are provided movably to the supporting plate 31, but the first movable plate 36a and the second movable plate 36b may be fixed to the supporting plate 31 and the fixed plate 32 may be provided movably to the supporting plate 31.

In the first to fourth embodiments, a multi-joint type transport robot that linearly advances/withdraws its hands by the movement of the joints is used for each of the indexer robot IR and the main robot MR, but a linear-type transport robot that advances/withdraws by linearly sliding the hands to a substrate W may be used.

The order of operation by the indexer robot IR and the main robot MR may be changed as required for example depending on the processing speeds of the reversing units RT1 and RT2, the top surface cleaning units SS and the back surface cleaning units SSR.

Note that the operation of the main robot MR to transport substrates W preferably includes at least one of the transport operation between the reversing unit RT1 (or RT1a) and the substrate platform PASS1 and the transport operation between the reversing unit RT2 (or RT2a) and the substrate platform PASS1.

(6) Correspondence Between Elements in Claims and Elements in Embodiments

In the following paragraphs, non-limiting examples of correspondences between various elements recited in the claims below and those described above with respect to various preferred embodiments of the present invention are explained.

In the embodiments described above, the processing block 11 is an example of the processing region, the indexer block 10 is an example of the carrying in and out region, the region between the indexer block 10 and the processing block 11 in which the substrate platform and the reversing unit are provided in a stacked manner is an example of the interface region, the top surface cleaning unit SS and the back surface cleaning unit SSR are examples of the processing section, the first processing section and the second processing section, and the main robot MR is an example of the first transport device.

The substrate platforms PASS1 and PASS2 are examples of the substrate platform, the reversing units RT1, RT2, RT1a, and RT2a are examples of the reversing device, the hands MRH1 and MRH2 are examples of the first supporter, the back surface cleaning unit SSR is an example of a back surface cleaning processing section, and the top surface cleaning unit SS is an example of the top surface cleaning processing section.

Furthermore, the carrier platform 40 is an example of a container platform, the indexer robot IR is an example of the second transport device, and the hands IRH1 and IRH2 are examples of the second supporter.

The reversing units RT1, RT2, RT1a, and RT2a are examples of the reversing device, the fixed plate 32, the first movable plate 36a, the support pins 39a and 39c, the cylinders 37a and 43a, and the third movable plate 41a are an example of the first holding mechanism, the fixed plate 32, the second movable plate 36b, the support pins 39b and 39d, the cylinders 37b and 43b, and the fourth movable plate 41b are an example of the second holding mechanism, the supporting plate 31 is an example of the supporting member, the rotary actuator 38 is an example of the rotating device, the fixed plate 32, the third movable plate 41a and the fourth movable plate 41b are an example of the common reverse holding member, the first movable plate 36a is an example of the first reverse holding member, the second movable plate 36b is an example of the second reverse holding member, the support pins 39a are an example of the third supporter, the support pins 39c are an example of the fourth supporter, the support pins 39b are an example of the fifth supporter, the support pins 39d are an example of the sixth supporter, the cylinders 37a and 43a are an example of the first driving mechanism, and the cylinders 37b and 43b are an example of the second driving mechanism.

As various elements recited in the claims, various other elements with configurations or functions as recited in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A substrate processing apparatus that processes a substrate having a top surface and a back surface, comprising:
a processing region in which the substrate is processed;
a carrying in and out region through which the substrate is carried into or carried out from said processing region; and
an interface region through which the substrate is transferred between said processing region and said carrying in and out region,
said processing region including
a processing section that processes the substrate, and
a first transport device that rotates around a vertical axis and transports the substrate between said interface region and said processing section,
said first transport device having first and second supporters that are provided one above the other at a predetermined distance from each other,
said first and second supporters being configured to support substrates, respectively,
said interface region including
first and second substrate platforms arranged in a stacked manner so as to be adjacent to each other and on which the substrate is placed,
third and fourth substrate platforms arranged in a stacked manner so as to be adjacent to each other and on which the substrate is placed, and
first and second reversing devices that reverse the top surface and the back surface of the substrate,
said first and second substrate platforms and said third and fourth substrate platforms being arranged in a stacked manner such that said first and second substrate platforms are positioned above said third and fourth substrate platforms, in that order,
said first reversing device being provided immediately above an upper substrate platform of said first and second substrate platforms in a stacked manner so as to be adjacent to said upper substrate platform,
said second reversing device being provided immediately below a lower substrate platform of said third and fourth substrate platforms in a stacked manner so as to be adjacent to said lower substrate platform,
each of said first and second reversing devices being configured to support two substrates one above the other at said predetermined distance from each other and to simultaneously reverse a top surface and a back surface of each of the two substrates,
said interface region, said processing section and said first transport device being arranged so that the rotation angle of said first transport device during the transport of the substrate between said interface region and said processing section is 90 degrees,
said substrate processing apparatus further comprising a controller that is configured to control said first transport device, wherein said first transport device is moved up and down while supporting the two substrates with said first and second supporters to transport the two substrates simultaneously between said first and second substrate platforms and said first reversing device, and wherein said first transport device is moved up and down while supporting the two substrates by said first and second supporters to transport the two substrates simultaneously between said third and fourth substrate platforms and said second reversing device; and
wherein each of said first and second supporters of said first transport device is configured to be capable of advancing withdrawing in a horizontal direction, and
each of said first and second supporters advances/withdraws in a first advancing/withdrawing direction with respect to said first, second, third and fourth substrate platforms during transfer or receipt of the substrate to or from said first and second substrate platforms and said third and fourth platforms and in a second advancing/withdrawing direction that is perpendicular to said first direction during carrying in/out of the substrate to/from said processing section.

2. The substrate processing apparatus according to claim 1, wherein said processing section includes
- a first processing section aligned on one side of said first transport device in the direction parallel to said second direction, and
- a second processing section aligned on an opposite side of said first transport device in the direction parallel to said second direction.

3. The substrate processing device according to claim 2, wherein at least one of said first or second processing sections includes a back surface cleaning processing section that cleans the back surface of the substrate.

4. The substrate processing apparatus according to claim 3, wherein each of said first and second processing sections includes said back surface cleaning processing section.

5. The substrate processing apparatus according to claim 4, wherein said back surface cleaning processing section in said first processing section includes a plurality of back surface cleaning units arranged in a plurality of stages, and
- said back surface cleaning processing section in said second processing section includes a plurality of back surface cleaning units arranged in a plurality of stages.

6. The substrate processing apparatus according to claim 3, wherein said first processing section includes said back surface cleaning processing section and said second processing section includes a top surface cleaning processing section that cleans the top surface of the substrate.

7. The substrate processing apparatus according to claim 6, wherein said back surface cleaning processing section in said first processing section includes a plurality of back surface cleaning units arranged in a plurality of stages, and said top surface cleaning processing section in said second processing section includes a plurality of top surface cleaning units arranged in a plurality of stages.

8. The substrate processing apparatus according to claim 1, wherein said carrying in and out region includes a container platform on which a storing container for storing the substrate is provided, and
- a second transport device that rotates around a vertical axis and transports a substrate between the storing container provided on said container platform and said interface region, and
- said second transport device has a third supporter supporting a substrate and capable of advancing/withdrawing horizontally.

9. The substrate processing apparatus according to claim 1, wherein each of said first and second reversing devices includes
- a first holding mechanism that holds the substrate in a state perpendicular to a third axis,
- a second holding mechanism that holds the substrate in the state perpendicular to said third axis,
- a supporting member that supports said first and second holding mechanisms so that said first and second holding mechanisms overlap with each other in a direction of said third axis, and
- a rotating device that integrally rotates said supporting member together with said first and second holding mechanisms around a fourth axis that is perpendicular to said third axis.

10. The substrate processing apparatus according to claim 9, wherein said first and second holding mechanisms include a common reverse holding member having a first surface and a second surface that are perpendicular to said third axis, said first holding mechanism includes
- a plurality of fourth supporters that are provided on said first surface of said common reverse holding member and support a periphery of the substrate,
- a first reverse holding member provided so as to face said first surface of said common reverse holding member,
- a plurality of fifth supporters that are provided on a surface, which faces said common reverse holding member, of said first reverse holding member and support the periphery of the substrate, and
- a first driving mechanism that moves at least one of said first reverse holding member or said common reverse holding member so that said first reverse holding member and said common reverse holding member are selectively shifted between a state where said first reverse holding member and said common reverse holding member are spaced apart from each other in the direction of said third axis and a state where said first reverse holding member and said common reverse holding member are close to each other, and said second holding mechanism includes
- a plurality of sixth supporters that are provided on said second surface of said common reverse holding member and support the periphery of the substrate,
- a second reverse holding member provided so as to face said second surface of said common reverse holding member,
- a plurality of seventh supporters that are provided on a surface, which faces said common reverse holding member, of said second reverse holding member and support the periphery of the substrate, and
- a second driving mechanism that moves at least one of said second reverse holding member or said common reverse holding member so that said second reverse holding member and said common reverse holding member are selectively shifted between a state where said second reverse holding member and said common reverse holding member are spaced apart from each other in the direction of said third axis and a state where said second reverse holding member and said common reverse holding member are close to each other.

11. The substrate processing apparatus according to claim 1, wherein said processing section includes first and second back surface cleaning units that for cleaning the back surface of a substrate with the back surface being directed upward,
- wherein two substrates whose top surfaces are directed upward are placed on said third and fourth substrate platforms, and wherein:
- said controller is configured to control said first transport device, wherein said first transport device receives the two substrates whose top surfaces are directed upward from said third and fourth substrate platforms with said first and second supporters, and simultaneously transfers the two substrates supported by said first and second supporters from said first and second supporters to said second reversing device,
- said controller is configured to control said second reversing device, wherein said second reversing device simultaneously reverses the two substrates transferred from said first and second supporters to have back surfaces of the two substrates directed upward,
- said controller is configured to control said first transport device, wherein said first transport device simultaneously receives the two substrates whose back surfaces are directed upward from said second reversing device with said first and second supporters, transfers the substrate supported by one of said first and second supporters to said first back surface cleaning unit, and transfers the substrate supported by the other of said first and second supporters to said second back surface cleaning unit, said controller is configured to control said first and second back surface cleaning units, wherein said first and second back surface cleaning units clean the back surface of the substrate transferred by said first or second supporter, said controller is configured to control said first transport device, wherein said first transport device receives the cleaned substrate from said first back surface cleaning unit with one of said first and second supporters, receives the cleaned substrate from said second back surface cleaning unit by the other of said first and second supporters, and simultaneously transfers the two substrates received by said first and second supporters from said first and second supporters to said first reversing device, said controller is configured to control said first reversing device, wherein said first reversing device simultaneously reverses the two substrates transferred from said first and second supporters to have the top surfaces of the two substrates directed upward, and said controller is configured to control said first transport device, wherein said first transport device simultaneously receives the two substrates whose top surfaces are directed upward from said first reversing device with said first and second supporters.

12. The substrate processing apparatus according to claim 1, wherein said processing section includes first and second top surface cleaning units that clean the top surface of the substrate with the top surface being directed upward, and first and second back surface cleaning units that clean the back surface of the substrate with the back surface being directed upward, said first and second substrate platforms are used in transporting the substrate from said processing region to said carrying in and out region, said third and fourth substrate platforms are used in transporting the substrate from said carrying in and out region to said processing region, two substrates whose top surfaces are directed upward are placed on said third and fourth substrate platforms, said controller is configured to control said first transport device, wherein said first transport device receives the two substrates whose top surfaces are directed upward from said third and fourth substrate platforms with said first and second supporters, transfers the substrate supported by one of said first and second supporters to said first top surface cleaning unit, and transfers the substrate supported by the other of said first and second supporters to said second top surface cleaning unit, said controller is configured to control said first and second top surface cleaning units, wherein said first and second top surface cleaning units clean the top surface of the substrate transferred by said first or second supporter, said controller is configured to control said first transport device, wherein said first transport device receives the cleaned substrate from said first top surface cleaning unit with one of said first and second supporters, receives the cleaned substrate from said second top surface cleaning unit with the other of said first and second supporters, and simultaneously transfers the two substrates received by said first and second supporters from said first and second supporters to said second reversing device, said controller is configured to control said second reversing device, wherein said second reversing device simultaneously reverses the two substrates transferred from said first and second supporters to have back surfaces of the two substrates directed upward, said controller is configured to control said first transport device, wherein said first transport device simultaneously receives the two substrates whose back surfaces are directed upward from said second reversing device with said first and second supporters, transfers the substrate supported by one of said first and second supporters to said first back surface cleaning unit, and transfers the substrate supported by the other of said first and second supporters to said second back surface cleaning unit, said controller is configured to control said first and second back surface cleaning units, wherein said first and second back surface cleaning units clean the back surface of the substrate transferred by said first or second supporter, said controller is configured to control said first transport device, wherein said first transport device receives the cleaned substrate from said first back surface cleaning unit with one of said first and second supporters, receives the cleaned substrate from said second back surface cleaning unit with the other of said first and second supporters, and simultaneously transfers the two substrates received by said first and second supporters from said first and second supporters to said first reversing device, said controller is configured to control said first reversing device, wherein said first reversing device simultaneously reverses the two substrates transferred from said first and second supporters to have the top surfaces of the two substrates directed upward, and said controller is configured to control said first transport device, wherein said first transport device simultaneously receives the two substrates whose top surfaces are directed upward from said first reversing device with said first and second supporters, and transfers the two substrates received by said first and second supporters from said first and second supporters to said first and second substrate platforms.

* * * * *